United States Patent
Amano et al.

(10) Patent No.: US 11,942,170 B2
(45) Date of Patent: *Mar. 26, 2024

(54) PULSE SIGNAL OUTPUT CIRCUIT AND SHIFT REGISTER

(71) Applicant: Semiconductor Energy Laboratory Co., Ltd., Atsugi (JP)

(72) Inventors: Seiko Amano, Kanagawa (JP); Kouhei Toyotaka, Kanagawa (JP); Hiroyuki Miyake, Kanagawa (JP); Aya Miyazaki, Kanagawa (JP); Hideaki Shishido, Kanagawa (JP); Koji Kusunoki, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/749,309

(22) Filed: May 20, 2022

(65) Prior Publication Data

US 2022/0284976 A1 Sep. 8, 2022

Related U.S. Application Data

(63) Continuation of application No. 16/458,304, filed on Jul. 1, 2019, now Pat. No. 11,348,653, which is a (Continued)

(30) Foreign Application Priority Data

Mar. 2, 2010 (JP) .................................. 2010-045884

(51) Int. Cl.
*G11C 19/00* (2006.01)
*G09G 3/36* (2006.01)
(Continued)

(52) U.S. Cl.
CPC ............ *G11C 19/28* (2013.01); *G09G 3/3677* (2013.01); *G09G 3/3696* (2013.01);
(Continued)

(58) Field of Classification Search
CPC ............ G11C 19/28; G09G 2310/0286; G09G 3/3677
See application file for complete search history.

(56) References Cited

U.S. PATENT DOCUMENTS 4,623,908 A  11/1986  Oshima et al.
5,410,583 A   4/1995  Weisbrod et al.
(Continued)

FOREIGN PATENT DOCUMENTS

CN  001577028 A  2/2005
CN  001716778 A  1/2006
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Tuan T Lam
(74) *Attorney, Agent, or Firm* — Fish & Richardson P.C.

(57) ABSTRACT

An object is to provide a pulse signal output circuit capable of operating stably and a shift register including the pulse signal output circuit. A pulse signal output circuit according to one embodiment of the disclosed invention includes first to tenth transistors. The ratio W/L of the channel width W to the channel length L of the first transistor and W/L of the third transistor are each larger than W/L of the sixth transistor. W/L of the fifth transistor is larger than W/L of the sixth transistor. W/L of the fifth transistor is equal to W/L of (Continued)

the seventh transistor. W/L of the third transistor is larger than W/L of the fourth transistor. With such a structure, a pulse signal output circuit capable of operating stably and a shift register including the pulse signal output circuit can be provided.

2 Claims, 14 Drawing Sheets

Related U.S. Application Data continuation of application No. 15/203,885, filed on Jul. 7, 2016, now Pat. No. 10,340,021, which is a continuation of application No. 14/245,097, filed on Apr. 4, 2014, now Pat. No. 9,396,812, which is a continuation of application No. 13/891,364, filed on May 10, 2013, now Pat. No. 8,693,617, which is a continuation of application No. 13/036,140, filed on Feb. 28, 2011, now Pat. No. 8,442,183.

(51) Int. Cl.
G11C 19/18 (2006.01)
G11C 19/28 (2006.01)
H01L 25/03 (2006.01)
H01L 27/12 (2006.01)
H03K 19/00 (2006.01)
H05K 7/02 (2006.01)

(52) U.S. Cl.
CPC ............ *G11C 19/184* (2013.01); *H01L 25/03* (2013.01); *H01L 27/1222* (2013.01); *H01L 27/1225* (2013.01); *H01L 27/124* (2013.01); *H01L 27/1251* (2013.01); *H01L 27/127* (2013.01); *H01L 27/1288* (2013.01); *H03K 19/0013* (2013.01); *H05K 7/02* (2013.01); *G09G 2300/0809* (2013.01); *G09G 2310/0286* (2013.01); *H01L 2924/0002* (2013.01)

(56) References Cited

U.S. PATENT DOCUMENTS

| 5,731,856 | A | 3/1998 | Kim et al. |
| 5,744,864 | A | 4/1998 | Cillessen et al. |
| 6,126,743 | A | 10/2000 | Saegusa et al. |
| 6,294,274 | B1 | 9/2001 | Kawazoe et al. |
| 6,304,105 | B1 | 10/2001 | Fujiyoshi |
| 6,426,743 | B1 | 7/2002 | Yeo et al. |
| 6,563,174 | B2 | 5/2003 | Kawasaki et al. |
| 6,727,522 | B1 | 4/2004 | Kawasaki et al. |
| 6,813,332 | B2 | 11/2004 | Nagao et al. |
| 6,845,140 | B2 | 1/2005 | Moon et al. |
| 6,928,135 | B2 | 8/2005 | Sasaki et al. |
| 6,928,136 | B2 | 8/2005 | Nagao et al. |
| 6,970,530 | B1 | 11/2005 | Wang et al. |
| 6,975,142 | B2 | 12/2005 | Azami et al. |
| 7,023,410 | B2 | 4/2006 | Lee et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,071,765 | B2 | 7/2006 | Kamijo |
| 7,105,868 | B2 | 9/2006 | Nause et al. |
| 7,116,748 | B2 | 10/2006 | Nagao et al. |
| 7,151,278 | B2 | 12/2006 | Nagao et al. |
| 7,173,676 | B2 | 2/2007 | Jeon et al. |
| 7,211,825 | B2 | 5/2007 | Shih et al. |
| 7,282,782 | B2 | 10/2007 | Hoffman et al. |
| 7,289,593 | B2 | 10/2007 | Tobita. et al. |
| 7,297,977 | B2 | 11/2007 | Hoffman et al. |
| 7,323,356 | B2 | 1/2008 | Hosono et al. |
| 7,324,123 | B2 | 1/2008 | Yamazaki et al. |
| 7,369,111 | B2 | 5/2008 | Jeon et al. |
| 7,382,347 | B2 | 6/2008 | Sasaki et al. |
| 7,385,224 | B2 | 6/2008 | Ishii et al. |
| 7,394,102 | B2 | 7/2008 | Nagao et al. |
| 7,397,885 | B2 | 7/2008 | Moon et al. |
| 7,402,506 | B2 | 7/2008 | Levy et al. |
| 7,403,586 | B2 | 7/2008 | Tobita. et al. |
| 7,405,716 | B2 | 7/2008 | Lee et al. |
| 7,411,209 | B2 | 8/2008 | Endo et al. |
| 7,443,202 | B2 | 10/2008 | Kimura et al. |
| 7,450,681 | B2 | 11/2008 | Wei et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,489,758 | B2 | 2/2009 | Lan |
| 7,501,293 | B2 | 3/2009 | Ito et al. |
| 7,511,709 | B2 | 3/2009 | Koyama et al. |
| 7,522,145 | B2 | 4/2009 | Lee et al. |
| 7,573,971 | B2 | 8/2009 | Tseng et al. |
| 7,583,247 | B2 | 9/2009 | Park et al. |
| 7,586,328 | B2 | 9/2009 | Chen |
| 7,586,478 | B2 | 9/2009 | Azami et al. |
| 7,590,214 | B2 | 9/2009 | Liu et al. |
| 7,612,770 | B2 | 11/2009 | Lee |
| 7,649,971 | B2 | 1/2010 | Kim et al. |
| 7,656,004 | B2 | 2/2010 | Jeon et al. |
| 7,674,650 | B2 | 3/2010 | Akimoto et al. |
| 7,687,808 | B2 | 3/2010 | Umezaki |
| 7,696,974 | B2 | 4/2010 | Moon et al. |
| 7,732,819 | B2 | 6/2010 | Akimoto et al. |
| 7,738,623 | B2 | 6/2010 | Tobita |
| 7,792,237 | B2 | 9/2010 | Chen et al. |
| 7,932,888 | B2 | 4/2011 | Miyake |
| 7,964,876 | B2 | 6/2011 | Umezaki |
| 7,978,274 | B2 | 7/2011 | Umezaki et al. |
| 8,054,279 | B2 | 11/2011 | Umezaki et al. |
| 8,054,934 | B2 | 11/2011 | Chiang et al. |
| 8,102,340 | B2 | 1/2012 | Lee et al. |
| 8,107,586 | B2 | 1/2012 | Shin et al. |
| 8,116,424 | B2 | 2/2012 | Chiang et al. |
| 8,179,357 | B2 | 5/2012 | Otose |
| 8,212,802 | B2 | 7/2012 | Jeon |
| 8,269,714 | B2 | 9/2012 | Furuta et al. |
| 8,310,474 | B2 | 11/2012 | Koyama et al. |
| 8,314,765 | B2 | 11/2012 | Umezaki |
| 8,318,551 | B2 * | 11/2012 | Akimoto ............ H01L 29/66969 257/E21.414 |
| 8,320,516 | B2 | 11/2012 | Toyotaka |
| 8,369,478 | B2 | 2/2013 | Miyake |
| 8,442,183 | B2 | 5/2013 | Amano et al. |
| 8,508,459 | B2 | 8/2013 | Miyake |
| 8,520,159 | B2 | 8/2013 | Umezaki et al. |
| 8,531,376 | B2 | 9/2013 | Shimoda |
| 8,576,978 | B2 | 11/2013 | Toyotaka |
| 8,693,617 | B2 | 4/2014 | Amano et al. |
| 8,742,811 | B2 | 6/2014 | Umezaki |
| 8,743,044 | B2 | 6/2014 | Umezaki et al. |
| 8,766,901 | B2 | 7/2014 | Miyake |
| 8,774,347 | B2 | 7/2014 | Umezaki |
| 8,902,145 | B2 | 12/2014 | Umezaki et al. |
| 8,908,115 | B2 | 12/2014 | Umezaki et al. |
| 8,923,471 | B2 | 12/2014 | Miyake |
| 9,024,930 | B2 | 5/2015 | Nagao et al. |
| 9,036,767 | B2 | 5/2015 | Umezaki |
| 9,263,468 | B2 | 2/2016 | Umezaki et al. |
| 9,311,876 | B2 | 4/2016 | Umezaki |
| 9,396,812 | B2 | 7/2016 | Amano et al. |
| 9,406,699 | B2 | 8/2016 | Umezaki |
| 9,536,903 | B2 | 1/2017 | Umezaki et al. |
| 9,590,632 | B2 | 3/2017 | Nagao et al. |
| 9,606,408 | B2 | 3/2017 | Umezaki et al. |
| 10,048,558 | B2 | 8/2018 | Umezaki et al. |
| 10,304,399 | B2 | 5/2019 | Nagao et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, II et al. |
| 2004/0038446 | A1 | 2/2004 | Takeda et al. |

(56) References Cited

U.S. PATENT DOCUMENTS

| | | |
|---|---|---|
| 2004/0127038 A1 | 7/2004 | Carcia et al. |
| 2004/0140839 A1 | 7/2004 | Nagao et al. |
| 2004/0217935 A1 | 11/2004 | Jeon et al. |
| 2004/0239608 A1 | 12/2004 | Chung |
| 2005/0017302 A1 | 1/2005 | Hoffman |
| 2005/0062515 A1 | 3/2005 | Nagao et al. |
| 2005/0185752 A1 | 8/2005 | Sasaki et al. |
| 2005/0199959 A1 | 9/2005 | Chiang et al. |
| 2005/0264514 A1 | 12/2005 | Kim et al. |
| 2006/0007085 A1 | 1/2006 | Kim et al. |
| 2006/0035452 A1 | 2/2006 | Carcia et al. |
| 2006/0043377 A1 | 3/2006 | Hoffman et al. |
| 2006/0044247 A1 | 3/2006 | Jang et al. |
| 2006/0061385 A1 | 3/2006 | Jinta et al. |
| 2006/0061535 A1 | 3/2006 | Kim et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0125518 A1 | 6/2006 | Morosawa et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0238482 A1 | 10/2006 | Jang et al. |
| 2006/0244107 A1 | 11/2006 | Sugihara et al. |
| 2006/0244391 A1 | 11/2006 | Shishido et al. |
| 2006/0244699 A1 | 11/2006 | Yamazaki |
| 2006/0280279 A1 | 12/2006 | Nagao et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0151144 A1 | 7/2007 | Hou et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0206643 A1 | 9/2007 | Egan et al. |
| 2007/0247932 A1 | 10/2007 | Tobita |
| 2007/0252928 A1 | 11/2007 | Ito et al. |
| 2007/0272922 A1 | 11/2007 | Kim et al. |
| 2007/0287296 A1 | 12/2007 | Chang |
| 2007/0296660 A1 | 12/2007 | Kimura et al. |
| 2008/0006877 A1 | 1/2008 | Mardilovich et al. |
| 2008/0011861 A1 | 1/2008 | Ikeda et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0062112 A1 | 3/2008 | Umezaki |
| 2008/0073653 A1 | 3/2008 | Iwasaki |
| 2008/0079001 A1 | 4/2008 | Umezaki et al. |
| 2008/0080661 A1 | 4/2008 | Tobita |
| 2008/0083950 A1 | 4/2008 | Pan et al. |
| 2008/0106191 A1 | 5/2008 | Kawase |
| 2008/0123799 A1 | 5/2008 | Otose |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0187089 A1 | 8/2008 | Miyayama et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0258998 A1* | 10/2008 | Miyake ............... H01L 27/1251 377/79 |
| 2008/0278464 A1 | 11/2008 | Yamamoto et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308805 A1 | 12/2008 | Akimoto et al. |
| 2008/0308806 A1 | 12/2008 | Akimoto et al. |
| 2009/0002590 A1 | 1/2009 | Kimura |
| 2009/0008639 A1 | 1/2009 | Akimoto et al. |
| 2009/0027083 A1 | 1/2009 | Kimura et al. |
| 2009/0068773 A1 | 3/2009 | Lai et al. |
| 2009/0073105 A1 | 3/2009 | Chiang et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0239335 A1 | 9/2009 | Akimoto et al. |
| 2009/0251443 A1 | 10/2009 | Jinta |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2009/0322716 A1 | 12/2009 | Azami et al. |
| 2010/0007386 A1 | 1/2010 | Jinta |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0134476 A1 | 6/2010 | Zebedee et al. |
| 2010/0134708 A1 | 6/2010 | Kimura et al. |
| 2010/0136743 A1 | 6/2010 | Akimoto et al. |
| 2010/0163874 A1 | 7/2010 | Koyama et al. |
| 2010/0201659 A1 | 8/2010 | Miyake et al. |
| 2011/0084960 A1 | 4/2011 | Miyake et al. |
| 2011/0148846 A1 | 6/2011 | Arasawa et al. |
| 2011/0216874 A1 | 9/2011 | Toyotaka |
| 2011/0216875 A1 | 9/2011 | Miyake |
| 2011/0216876 A1 | 9/2011 | Amano et al. |
| 2011/0227066 A1 | 9/2011 | Umezaki |
| 2011/0260169 A1 | 10/2011 | Umezaki et al. |
| 2011/0285675 A1 | 11/2011 | Amano et al. |
| 2011/0285688 A1 | 11/2011 | Miyake et al. |
| 2012/0032615 A1 | 2/2012 | Kikuchi et al. |
| 2012/0049184 A1 | 3/2012 | Umezaki et al. |
| 2012/0056860 A1 | 3/2012 | Umezaki et al. |
| 2012/0076256 A1 | 3/2012 | Yonemaru et al. |
| 2012/0082287 A1 | 4/2012 | Moriwaki |
| 2012/0087459 A1 | 4/2012 | Nakamizo et al. |
| 2012/0087460 A1 | 4/2012 | Moriwaki |
| 2013/0050162 A1 | 2/2013 | Toyotaka |
| 2013/0135023 A1 | 5/2013 | Miyake |
| 2016/0141309 A1 | 5/2016 | Umezaki et al. |
| 2016/0190174 A1 | 6/2016 | Umezaki |
| 2017/0033125 A1 | 2/2017 | Umezaki |
| 2017/0179161 A1 | 6/2017 | Umezaki et al. |
| 2017/0243554 A1 | 8/2017 | Nagao et al. |
| 2018/0348561 A1 | 12/2018 | Umezaki et al. |

FOREIGN PATENT DOCUMENTS

| | | |
|---|---|---|
| CN | 101154342 A | 4/2008 |
| CN | 101166023 A | 4/2008 |
| CN | 101221818 A | 7/2008 |
| CN | 101276648 A | 10/2008 |
| CN | 101504829 A | 8/2009 |
| CN | 100583295 C | 1/2010 |
| EP | 0651395 A | 5/1995 |
| EP | 1737044 A | 12/2006 |
| EP | 1906414 A | 4/2008 |
| EP | 1942176 A | 7/2008 |
| EP | 1959420 A | 8/2008 |
| EP | 2189988 A | 5/2010 |
| EP | 2226847 A | 9/2010 |
| EP | 3223283 A | 9/2017 |

(56) References Cited

FOREIGN PATENT DOCUMENTS

| | | | |
|---|---|---|---|
| GB | 2343068 | * | 4/2000 |
| JP | 60-198861 A | | 10/1985 |
| JP | 63-210022 A | | 8/1988 |
| JP | 63-210023 A | | 8/1988 |
| JP | 63-210024 A | | 8/1988 |
| JP | 63-215519 A | | 9/1988 |
| JP | 63-239117 A | | 10/1988 |
| JP | 63-242020 A | | 10/1988 |
| JP | 63-265818 A | | 11/1988 |
| JP | 02-268019 A | | 11/1990 |
| JP | 03-293641 A | | 12/1991 |
| JP | 05-251705 A | | 9/1993 |
| JP | 07-182891 A | | 7/1995 |
| JP | 08-264794 A | | 10/1996 |
| JP | 11-505377 | | 5/1999 |
| JP | 2000-044236 A | | 2/2000 |
| JP | 2000-150900 A | | 5/2000 |
| JP | 2001-044820 A | | 2/2001 |
| JP | 2002-076356 A | | 3/2002 |
| JP | 2002-289859 A | | 10/2002 |
| JP | 2003-076346 A | | 3/2003 |
| JP | 2003-086000 A | | 3/2003 |
| JP | 2003-086808 A | | 3/2003 |
| JP | 2004-103957 A | | 4/2004 |
| JP | 2004-226429 A | | 8/2004 |
| JP | 2004-273614 A | | 9/2004 |
| JP | 2004-273732 A | | 9/2004 |
| JP | 2004-334216 A | | 11/2004 |
| JP | 2005-012944 A | | 1/2005 |
| JP | 2005-037842 A | | 2/2005 |
| JP | 2005-522734 | | 7/2005 |
| JP | 2005-326881 A | | 11/2005 |
| JP | 2006-277860 A | | 10/2006 |
| JP | 2006-351165 A | | 12/2006 |
| JP | 2007-096055 A | | 4/2007 |
| JP | 2007-123861 A | | 5/2007 |
| JP | 2007-207413 A | | 8/2007 |
| JP | 2007-317344 A | | 12/2007 |
| JP | 2008-089874 A | | 4/2008 |
| JP | 2008-089915 A | | 4/2008 |
| JP | 2008-107807 A | | 5/2008 |
| JP | 2008-122939 A | | 5/2008 |
| JP | 2008-197643 A | | 8/2008 |
| JP | 2008-281671 A | | 11/2008 |
| JP | 2009-177296 A | | 8/2009 |
| JP | 2009-193981 A | | 8/2009 |
| JP | 2009-302631 A | | 12/2009 |
| JP | 2010-027194 A | | 2/2010 |
| JP | 2010-033690 A | | 2/2010 |
| JP | 2011-030171 A | | 2/2011 |
| JP | 2011-205624 A | | 10/2011 |
| JP | 2011-205627 A | | 10/2011 |
| JP | 5164383 | | 3/2013 |
| JP | 5180029 | | 4/2013 |
| JP | 5671650 | | 2/2015 |
| KR | 10-1362952 | | 2/2014 |
| KR | 10-1392418 | | 5/2014 |
| TW | 533400 | | 5/2003 |
| TW | I227451 | | 2/2005 |
| TW | 200703908 | | 1/2007 |
| TW | 200743084 | | 11/2007 |
| TW | 200843348 | | 11/2008 |
| TW | 200844926 | | 11/2008 |
| TW | 200912859 | | 3/2009 |
| WO | WO-2003/034438 | | 4/2003 |
| WO | WO-2003/087921 | | 10/2003 |
| WO | WO-2004/104981 | | 12/2004 |
| WO | WO-2004/114391 | | 12/2004 |
| WO | WO-2007/080813 | | 7/2007 |
| WO | WO-2009/028353 | | 3/2009 |
| WO | WO-2009/034750 | | 3/2009 |
| WO | WO-2011/108343 | | 9/2011 |
| WO | WO-2011/108345 | | 9/2011 |
| WO | WO-2011/108678 | | 9/2011 |

OTHER PUBLICATIONS

Asaoka. Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung. T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (Zno Tfts) for Amlcds", J. Soc. Inf. Display (Journal of the Society for Information Display), 2007, vol. 15, No. 1, p. 17-22.

Hosono.H, "68.3:Invited Paper: Transparent Amorphous Oxide Semiconductors for High Performance TFT", SID Digest '07 : SID International Symposium Digest of Technical Papers, 2007, vol. 38, pp. 1830-1833.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

(56) References Cited

OTHER PUBLICATIONS

Jin.D et al., "65.2: Distinguished Paper: World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] At Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Kurokawa. Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06: Proceedings of the 13th International Display Workshops, Dec. 7, 2006, pp. 663-666.

Lee.J et al., "World's Largest (15-inch) XGA AMLCD Panel Using IGZO Oxide TFT", SID Digest '08: SID International Symposium Digest of Technical Papers, May 20, 2008, vol. 39, pp. 625-628.

Lee.M et al., "15.4: Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamizo.M et al., "4.2: A Low Power Consumption and High Reliability Architecture for a-Si TFT Gate Driver on Glass", SID Digest '10 : SID International Symposium Digest of Technical Papers, 2010, pp. 28-31.

Nakamura.M, "Synthesis of Homologous Compound with New Long-Period Structure", Nirim Newsletter, Mar. 1, 1995, vol. 150, pp. 1-4.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada. T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Electronic Transport Properties of Amorphous Indium-Gallium-Zinc Oxide Semiconductor Upon Exposure To Water", Appl. Phys. Lett. (Applied Physics Letters) , 2008, vol. 92, pp. 072104-1-072104-3.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "High performance amorphous oxide thin film transistors with self-aligned top-gate structure", IEDM 09: Technical Digest of International Electron Devices Meeting, Dec. 7, 2009, pp. 191-194.

(56) References Cited

OTHER PUBLICATIONS

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.S et al., "Challenge to Future Displays: Transparent AM-OLED Driven by Peald Grown ZnO TFT", IMID '07 DIGEST, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-IN. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/JP2011/055001) dated Apr. 26, 2011.

Written Opinion (Application No. PCT/JP2011/055001) dated Apr. 26, 2011.

Chinese Office Action (Application No. 201180011903.4) dated Oct. 23, 2014.

Taiwanese Office Action (Application No. 100106923) dated Jul. 30, 2015.

Taiwanese Office Action (Application No. 106106171) dated Aug. 3, 2017.

Taiwanese Office Action (Application No. 109128648) dated Nov. 19, 2021.

\* cited by examiner

PULSE SIGNAL OUTPUT CIRCUIT AND SHIFT REGISTER

CROSS-REFERENCE TO RELATED APPLICATIONS

This application is a continuation of U.S. application Ser. No. 16/458,304, filed Jul. 1, 2019 now allowed, which is a continuation of U.S. application Ser. No. 15/203,885, filed Jul. 7, 2016 now U.S. patent Ser. No. 10/340,021, which is a continuation of U.S. application Ser. No. 14/245,097, filed Apr. 4, 2014, now U.S. Pat. No. 9,396,812, which is a continuation of U.S. application Ser. No. 13/891,364, filed May 10, 2013, now U.S. Pat. No. 8,693,617, which is a continuation of U.S. application Ser. No. 13/036,140, filed Feb. 28, 2011, now U.S. Pat. No. 8,442,183, which claims the benefit of a foreign priority application filed in Japan as Serial No. 2010-045884 on Mar. 2, 2010, all of which are incorporated by reference.

TECHNICAL FIELD

The disclosed invention relates to a pulse signal output circuit and a shift register.

BACKGROUND ART

Transistors which are formed over flat plates such as glass substrates and typically used in liquid crystal display devices generally include semiconductor materials such as amorphous silicon or polycrystalline silicon. Although transistors including amorphous silicon have low field-effect mobility, they can be formed over larger glass substrates. In contrast, although transistors including polycrystalline silicon have high field-effect mobility, they need a crystallization process such, as laser annealing and are not always suitable for larger glass substrates.

On the other hand, transistors including oxide semiconductors as semiconductor materials have attracted attention. For example, Patent Documents 1 and 2 disclose a technique by which a transistor is formed using zinc oxide or an In—Ga—Zn—O-based oxide semiconductor as a semiconductor material and is used as a switching element of an image display device.

Transistors including oxide semiconductors in channel regions have higher field-effect mobility than transistors including amorphous silicon. Further, oxide semiconductor films can be formed at a temperature of 300° C. or lower by sputtering or the like, and the manufacturing process thereof is simpler than that of the transistors including polycrystalline silicon.

Such transistors including oxide semiconductors are expected to be used, as switching elements included in pixel portions and driver circuits of display devices such as liquid crystal displays, electroluminescent displays, and electronic papers. For example, Non-Patent Document 1 discloses a technique by which a pixel portion and a driver circuit of a display device include the transistors including oxide semiconductors.

Note that the transistors including oxide semiconductors are all n-channel transistors. Therefore, in the case where a driver circuit includes transistors including oxide semiconductors, the driver circuit includes only n-channel transistors.

REFERENCE

Patent Document

[Patent Document 1] Japanese Published Patent Application No. 2007-123861
[Patent Document 2] Japanese Published Patent Application No. 2007-096055

Non-Patent Document

[Non-Patent Document 1] T. Osada el al., "Development of Driver-Integrated Panel using Amorphous In—Ga—Zn-Oxide TFT", *Proc. SID '09 Digest*, 2009, pp. 184-187.

DISCLOSURE OF INVENTION

A driver circuit which is used in a display device or the like includes a shift register having a pulse signal output circuit, for example in the case where the shift register includes transistors having the same conductivity type, the shift register might have a problem of unstable operation, for example.

In view of the above problem, an object of one embodiment of the present invention is to provide a pulse signal output circuit capable of operating stably and a shift register including the pulse signal output circuit.

One embodiment of the present invention is a pulse signal output circuit including a first transistor, a second transistor, a third transistor, a fourth transistor, a fifth transistor, a sixth transistor, a seventh transistor, an eighth transistor, a ninth transistor, and a tenth transistor. A first terminal of the first transistor, a first terminal of the second transistor, and a first output terminal are electrically connected to one another. A first terminal of the third transistor, a first terminal of the fourth transistor, and a second output terminal are electrically connected to one another. A first terminal of the fifth transistor, a first terminal of the sixth transistor, and a first terminal of the seventh transistor are electrically connected to one another. A gate terminal of the first transistor, a gate terminal of the third transistor, and a second terminal of the seventh transistor are electrically connected to one another. A gate terminal of the second transistor, a gate terminal of the fourth transistor, a gate terminal of the sixth transistor, a first terminal of the eighth transistor, and a first terminal of the ninth transistor are electrically connected to one another. A second terminal of the eighth transistor and a first terminal of the tenth transistor are electrically connected to each other. The ratio W/L of the channel width W to the channel length L of the first transistor and the ratio W/L of the channel width W to the channel length L of the third transistor are each larger than the ratio W/L of the channel width W to the channel length L of the sixth transistor. The ratio WL of the channel width W to the channel length L of the fifth transistor is larger than the ratio W/L of the channel width W to the channel length L of the sixth transistor. The ratio W/L of the channel width W to the channel length L of the fifth transistor is equal to the ratio W/L of the channel width W to the channel length L of the seventh transistor. The ratio W/L of the channel width W to the channel length L of the third transistor is larger than the ratio W/L of the channel width W to the channel length L of the fourth transistor.

In the above pulse signal output circuit, in some cases, a first clock signal is input to a second terminal of the first transistor and a second terminal of the third transistor; a second clock signal is input to a gate terminal of the eighth transistor; a third clock signal is input to a gate terminal of the tenth transistor; a first potential is supplied to a second terminal of the second transistor, a second terminal of the fourth transistor, a second terminal of the sixth transistor, and a second terminal of the ninth transistor; a second potential higher than the first potential is supplied to a second terminal of the fifth transistor, a gate terminal of the seventh transistor, and a second terminal of the tenth transistor; a first pulse signal is input to a gate terminal of the fifth transistor and a gate terminal of the ninth transistor; and a second pulse signal is output from the first output terminal or the second output terminal.

Further, in some cases, a capacitor that is electrically connected to the gate terminal of the second transistor, the gate terminal of the fourth transistor, the gate terminal of the sixth transistor, the first terminal of the eighth transistor, and the first terminal of the ninth transistor is provided.

In the above pulse signal output circuit, in some cases, an eleventh transistor is provided; a first terminal of the eleventh transistor is electrically connected to the gate terminal of the second transistor, the gate terminal of the fourth transistor, the gate terminal of the sixth transistor, the first terminal of the eighth transistor, and the first terminal of the ninth transistor; a second terminal of the eleventh transistor is electrically connected to the second terminal of the eighth transistor, the first terminal of the ninth transistor, and the capacitor; and the channel width W of the eighth transistor and the channel width W of the tenth transistor are each smaller than the channel width W of the eleventh transistor.

In the above pulse signal output circuit, in some cases, the second potential is supplied to the second terminal of the eleventh transistor; and a third pulse signal is input to a gate terminal of the eleventh transistor.

A shift register can include a plurality of the above pulse signal output circuits. Specifically, in some cases, an n-stage shift register includes two pulse signal output circuits which are each not provided with the eleventh transistor and n (n: natural number) pulse signal output circuits which are each provided with the eleventh transistor; and each of the channel widths W of the eighth transistors in the pulse signal output circuits not provided with the eleventh transistors is larger than each of the channel widths W of the eighth transistors in the pulse signal output circuits provided with the eleventh transistors, or each of the channel widths W of the tenth transistors in the pulse signal output circuits not provided with the eleventh transistors is larger than each of the channel widths W of the tenth transistors in the pulse signal output circuits provided with the eleventh transistors.

An oxide semiconductor is preferably used for any of the transistors included in the pulse signal output circuit or the shift register. The shift register can include a plurality of the pulse signal output circuits.

Note that in the above pulse signal output circuit, the transistor includes an oxide semiconductor in some cases; however, the disclosed invention is not limited to this. A material which has off-state current characteristics equivalent to those of the oxide semiconductor, for example, a wide-gap material such as silicon carbide (specifically, for example, a semiconductor material whose energy gap $E_g$ is more than 3 eV) may be used.

Note that in this specification and the like, a term such as "over" or "below" does not necessarily mean that a component is placed "directly on" or "directly under" another component. For example, the expression "a gate electrode over a gate insulating layer" does not exclude the case where another component is placed between the gate insulating layer and the gate electrode.

In addition, in this specification and the like, terms such as "electrode" and "wiring" do not limit the functions of components. For example, an "electrode" can be used as part of a "wiring", and the "wiring" can be used as part of the "electrode". The terms such as "electrode" and "wiring" can also mean a combination of a plurality of "electrodes" and "wirings", for example.

Functions of a "source" and a "drain" might interchange when a transistor of opposite polarity is used or the direction of current flow is changed in circuit operation, for example. Therefore, in this specification, the terms "source" and "drain" can interchange.

Note that in this specification and the like, the term "electrically connected" includes the case where components are connected to each other through an object having any electric function. Here, there is no particular limitation on an object having any electric function as long as electric signals can be transmitted and received between components that are connected to each other through the object.

Examples of an "object having any electric function" are a switching element such as a transistor, a resistor, an inductor, a capacitor, and an element with a variety of functions in addition to an electrode and a wiring.

A pulse signal output circuit capable of operating stably and a shift register including the pulse signal output circuit can be provided.

BEST MODE FOR CARRYING OUT THE INVENTION

Figure 1A:
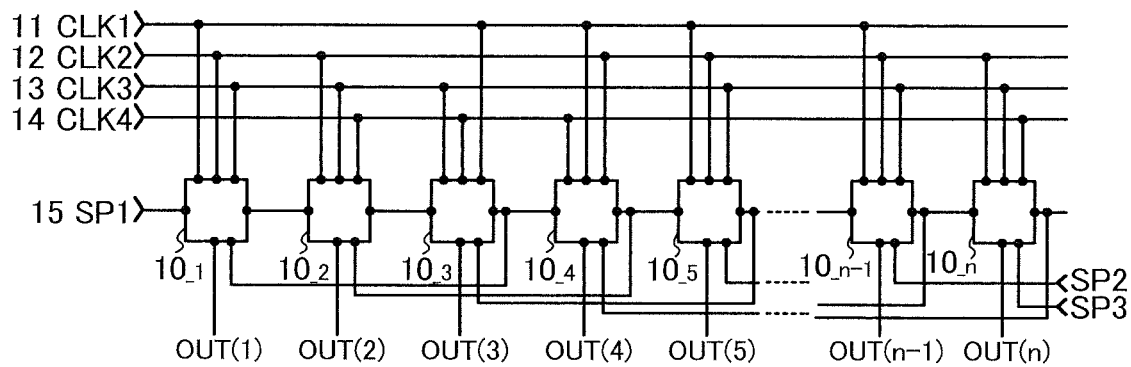
FIGS. 1A to 1C show configuration examples of a pulse signal output circuit and a shift register.

Examples of embodiments of the present invention will be described below with reference to the drawings. Note that the present invention is not limited to the following description. It will be readily appreciated by those skilled in the art that modes and details of the present invention can be changed in various ways without departing from the spirit and scope of the present invention. Therefore, the present invention should not be construed as being limited to the following description of the embodiments.

Note that the position, size, range, or the like of each component illustrated in drawings and the like is not accurately represented in some cases for easy understanding. Therefore, the disclosed invention is not necessarily limited to the position, size, range, or the like disclosed in the drawings and the like.

Note that in this specification and the like, ordinal numbers such as "first", "second", and "third" are used in order to avoid confusion among components and do not limit the number.

Embodiment 1

In this embodiment, configuration examples of a pulse signal output circuit and a shift register including the pulse signal output circuit will be described with reference to FIGS. 1A to 1C, FIG. 2, FIGS. 3A to 3C, and FIGS. 4A to 4C.

<Circuit Configuration>

First, configuration examples of a pulse signal output circuit and a shift register including the pulse signal output circuit will be described with reference to FIGS. 1A to 1C.

A shift register described in this embodiment includes first to n-th pulse signal output circuits $10_{-1}$ to $10_{-n}$ (n is a natural number greater than or equal to 2) and first to fourth signal lines 11 to 14 which transmit clock signals (see FIG. 1A). A first clock signal CLK1 is supplied to the first signal line 11. A second clock signal CLK2 is supplied to the second signal line 12. A third clock signal CLK3 is supplied to the third signal line 13. A fourth clock signal CLK4 is supplied to the fourth signal line 14.

The clock signal is a signal which alternates between an H-level signal (high potential) and an L-level signal (low potential) at regular intervals. Here, the first to fourth clock signals CLK1 to CLK4 are delayed by ¼ period sequentially. In this embodiment, by using the clock signals, control or the like of the pulse signal output circuit is performed.

Figure 1B:
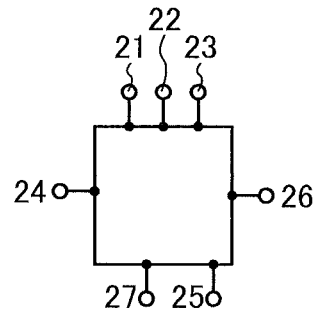

Each of the first to n-th pulse signal output circuits $10_{-1}$ to $10_{-n}$ includes a first input terminal 21, a second input terminal 22, a third input terminal 23, a fourth input terminal 24, a fifth input terminal 25, a first output terminal 26, and a second output terminal 27 (see FIG. 1B).

The first input terminal 21, the second input terminal 22, and the third input terminal 23 are electrically connected to any of the first to fourth signal lines 11 to 14. For example, the first input terminal 21 in the first pulse signal output circuit $10_{-1}$ is electrically connected to the first signal line 11, the second input terminal 22 in the first pulse signal output circuit $10_{-1}$ is electrically connected to the second signal line 12, and the third input terminal 23 in the first pulse signal output circuit $10_{-1}$ is electrically connected to the third signal line 13. In addition, the first input terminal 21 in the second pulse signal output circuit $10_{-2}$ is electrically connected to the second signal line 12, the second input terminal 22 in the second pulse signal output circuit $10_{-2}$ is electrically connected to the third signal line 13, and the third input terminal 23 in the second pulse signal output circuit $10_{-2}$ is electrically connected to the fourth signal line 14. Note that here, the case where the second to fourth signal lines 12 to 14 are connected to the n-th pulse signal output circuit $10_{-n}$ is described. However, the signal line that is connected to the n-th pulse signal output circuit $10_{-n}$ is changed depending on the value of n. Thus, it is to be noted that the configuration described herein is just an example.

In the m-th pulse signal output circuit (m is a natural number greater than or equal to 2) of the shift register described in this embodiment, the fourth input terminal 24 in the m-th pulse signal output circuit is electrically connected to the first output terminal 26 in the (m−1)-th pulse signal output circuit. The fifth input terminal 25 in the m-th pulse signal output circuit is electrically connected to the first output terminal 26 in the (m+2)-th pulse signal output circuit. The first input terminal 26 in the m-th pulse signal output circuit is electrically connected to the fourth input terminal 24 in the (m+1)-th pulse signal output circuit. The second output terminal 27 in the m-th pulse signal output circuit outputs a signal to an OUT(m).

For example, the fourth input terminal 24 in the third pulse signal output circuit $10_{-3}$ is electrically connected to the first output terminal 26 in the second pulse signal output circuit $10_{-2}$. The fifth input terminal 25 in the third pulse signal output circuit $10_{-3}$ is electrically connected to the first output terminal 26 in the fifth pulse signal output circuit $10_{-5}$. The first input terminal 26 in the third pulse signal output circuit $10_{-3}$ is electrically connected to the fourth input terminal 24 in the fourth pulse signal output circuit $10_{-4}$ and the fifth input terminal 25 in the first pulse signal output circuit $10_{-1}$.

In addition, a first start pulse (SP1) is input from a fifth wiring 15 to the fourth input terminal 24 in the first pulse signal output circuit $10_{-1}$. A pulse output from the previous stage is input to the fourth input terminal 24 in the k-th pulse signal output circuit $10_{-k}$ (k is a natural number greater than or equal to 2 and less than or equal to n). A second start pulse (SP2) is input to the fifth input terminal 25 in the (n−1)-th pulse signal output circuit $10_{-n-1}$. A third start pulse (SP3) is input to the fifth input terminal 25 in the n-th pulse signal output circuit $10_{-n}$. The second start pulse (SP2) and the third start pulse (SP3) may be input from the outside or generated inside the circuit.

Next, specific configurations of the first to n-th pulse signal output circuits $10_{-1}$ to $10_{-n}$ will be described.

Figure 1C:
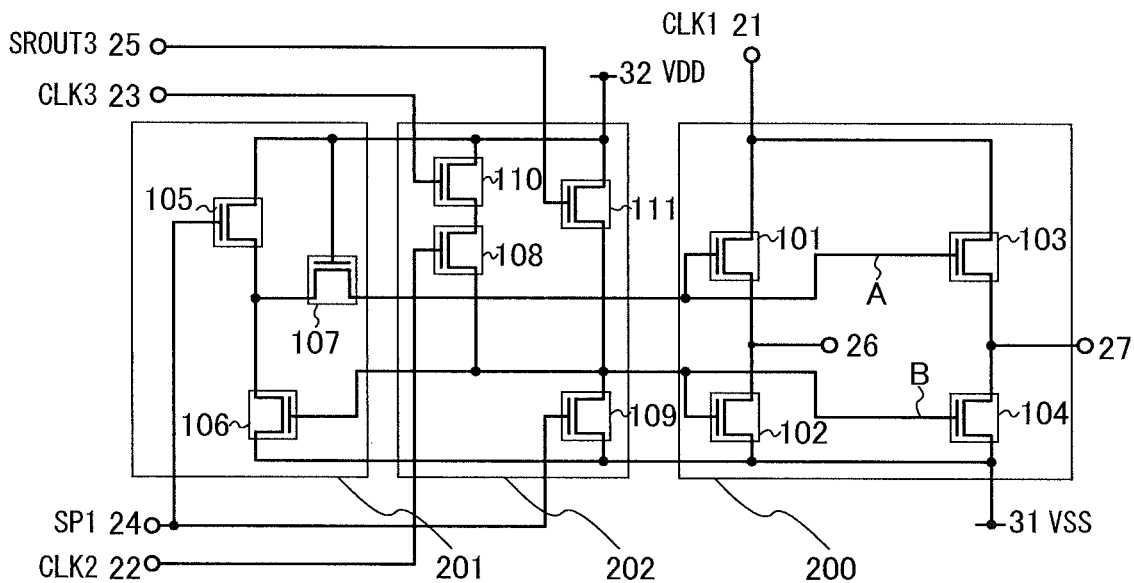

Each of the first to n-th pulse signal output circuits $10_{-1}$ to $10_n$ includes a pulse signal generation circuit 200 including first to fourth transistors 101 to 104; a first input signal generation circuit 201 including fifth to seventh transistors 105 to 107; and a second input signal generation circuit 202 including eighth to eleventh transistors 108 to 111 (see FIG. 1C). Further, signals are supplied to the first to eleventh transistors 101 to 111 from a first power supply line 31 and a second power supply line 32, in addition to the first to fifth input terminals 21 to 25.

A specific example of a configuration of the pulse signal generation circuit is as follows.

A first terminal (hereinafter, "first terminal" means one of a source terminal and a drain terminal) of the first transistor 101, a first terminal of the second transistor 102, and the first output terminal 26 are electrically connected to one another. Similarly, a first terminal of the third transistor 103, a first terminal of the fourth transistor 104, and the second output terminal 27 are electrically connected to one another. A gate terminal of the first transistor 101, a gate terminal of the third transistor 103, and an output terminal of the first input signal generation circuit are electrically connected to one another. A gate terminal of the second transistor 102, a gate terminal of the fourth transistor 104, and an output terminal of the second input signal generation circuit are electrically connected to one another.

A second terminal (hereinafter, "second terminal" means the other of the source terminal and the drain terminal) of the first transistor 101 and a second terminal of the third transistor are electrically connected to each other, and the first clock signal CLK1 is input to a node where they are connected to each other. The second terminal of the first transistor 101 and the second terminal of the third transistor function as the first input terminal 21 of the pulse signal output circuit. A second terminal of the second transistor 102 is supplied with a first potential (e.g., a low potential $V_{SS}$) through the first power supply line 31. A second terminal of the fourth transistor 104 is supplied with the first potential through the first power supply line 31.

A specific example of a configuration of the first input signal generation circuit is as follows.

A first terminal of the fifth transistor 105, a first terminal of the sixth transistor 106, and a first terminal of the seventh transistor 107 are electrically connected to one another. Further, a second terminal of the seventh transistor 107 functions as the output terminal of the first input signal generation circuit. The gate terminal of the fifth transistor 105 functions as a first input terminal of the first input signal generation circuit and also as the fourth input terminal 24 of the pulse signal output circuit.

A second potential is supplied to a second terminal of the fifth transistor 105 through the second power supply line 32. The first potential is supplied to a second terminal of the sixth transistor 106 through the first power supply line 31. A pulse signal from the previous stage (in the first pulse signal output circuit, the pulse signal is a start pulse signal) is input to a gate terminal of the fifth transistor 105. An output signal of the second input signal generation circuit is input to a gate terminal of the sixth transistor 106. The gate terminal of the sixth transistor 106 functions as a second input terminal of the first input signal generation circuit. The second potential is supplied to a gate terminal of the seventh transistor 107 through the second power supply line 32.

Although the seventh transistor 107 is provided in this embodiment, a configuration without the seventh transistor 107 may be employed. With the seventh transistor 107, an increase in potential of the first terminal of the fifth transistor 105, which might be caused by bootstrap operation, can be suppressed. That is to say, application of high voltage to a region between the gate and the source (or between the gate and the drain) of the fifth transistor 105 can be prevented; thus, deterioration of the fifth transistor 105 can be suppressed.

A specific example of a configuration of the second input signal generation circuit is as follows.

A second terminal of the tenth transistor 110 and a first terminal of the eighth transistor 108 are electrically connected to each other. A second terminal of the eighth transistor, a second terminal of the eleventh transistor, and a first terminal of the ninth transistor are electrically connected to one another, and function as the output terminal of the second input signal generation circuit.

The second potential is supplied to a first terminal of the eleventh transistor 111 and a first terminal of the tenth transistor 110 through the second power supply line 32. The first potential is supplied to a second terminal of the ninth transistor 109 through the first power supply line 31. A pulse signal from the stage following the next stage is input to a gate terminal of the eleventh transistor 111. The gate terminal of the eleventh transistor 111 functions as a first input terminal of the second input signal generation circuit and also as the fifth input terminal 25 of the pulse signal output circuit. The second clock signal CLK2 is input to a gate terminal of the eighth transistor 108. The gate terminal of the eighth transistor 108 functions as a second input terminal of the second input signal generation circuit and also as the second input terminal 22 of the pulse signal output circuit. A pulse signal from the previous stage (in the first pulse signal output circuit, the pulse signal is a start pulse signal) is input to a gate terminal of the ninth transistor 109. The gate terminal of the ninth transistor 109 functions as a third input terminal of the second input signal generation circuit and also as the fourth input terminal 24 of the pulse signal output circuit. The third clock signal CLK3 is input to a gate terminal of the tenth transistor 110. The gate terminal of the tenth transistor 110 functions as a fourth input terminal of the second input signal generation circuit and also as the third input terminal 23 of the pulse signal output circuit.

Note that components of the pulse signal output circuit (e.g., configuration examples of the pulse signal generation circuit, the first input signal generation circuit, and the second input signal generation circuit) are just examples, and the disclosed invention is not limited thereto.

In the following description of this embodiment, a node where the gate terminal of the first transistor 101, the gate terminal of the third transistor 103, and the output terminal of the first input signal generation circuit are connected to one another in the pulse signal output circuit in FIG. 1C is referred to as a node A. In addition, a node where the gate terminal of the second transistor 102, the gate terminal of the fourth transistor 104, and the output terminal of the second input signal generation circuit are connected to one another is referred to as a node B.

A capacitor for favorably performing bootstrap operation may be provided between the node A and the first output terminal 26. Furthermore, a capacitor electrically connected to the node B may be provided in order to hold the potential of the node B.

In FIG. 1C, the ratio W/L of the channel width W to the channel length L of the first transistor 101 and the ratio W/L of the channel width W to the channel length L of the third transistor 103 are each preferably larger than the ratio W/L of the channel width W to the channel length L of the sixth transistor 106.

In FIG. 1C, the ratio W/L of the channel width W to the channel length L of the fifth transistor 105 is preferably larger than the ratio W/L of the channel width W to the channel length L of the sixth transistor 106. The ratio W/L of the channel width W to the channel length L of the fifth transistor 105 is preferably equal to the ratio W/L of the channel width W to the channel length L of the seventh transistor 107. Alternatively, the ratio W/L of the channel width W to the channel length L of the fifth transistor 105 is preferably larger than the ratio W/L of the channel width W to the channel length L of the seventh transistor 107.

In FIG. 1C, the ratio W/L of the channel width W to the channel length L of the third transistor 103 is preferably larger than the ratio W/L of the channel width W to the channel length L of the fourth transistor 104.

In FIG. 1C, the channel width W of the eighth transistor 108 and the channel width W of the tenth transistor 110 are each preferably smaller than the channel width W of the eleventh transistor 111.

An oxide semiconductor is preferably used for the first to eleventh transistors 101 to 111. With the use of an oxide semiconductor, the off-state current of the transistors can be reduced. Further, the on-state current and field-effect mobility can be increased as compared with those in the case where amorphous silicon or the like is used. Furthermore, the deterioration of the transistors can be suppressed. Consequently, an electronic circuit that consumes low power, can operate at high speed, and operates with higher accuracy is realized. Note that the description of the transistor including an oxide semiconductor is omitted here because it is described in detail in an embodiment below.

<Operation>

Figure 2:
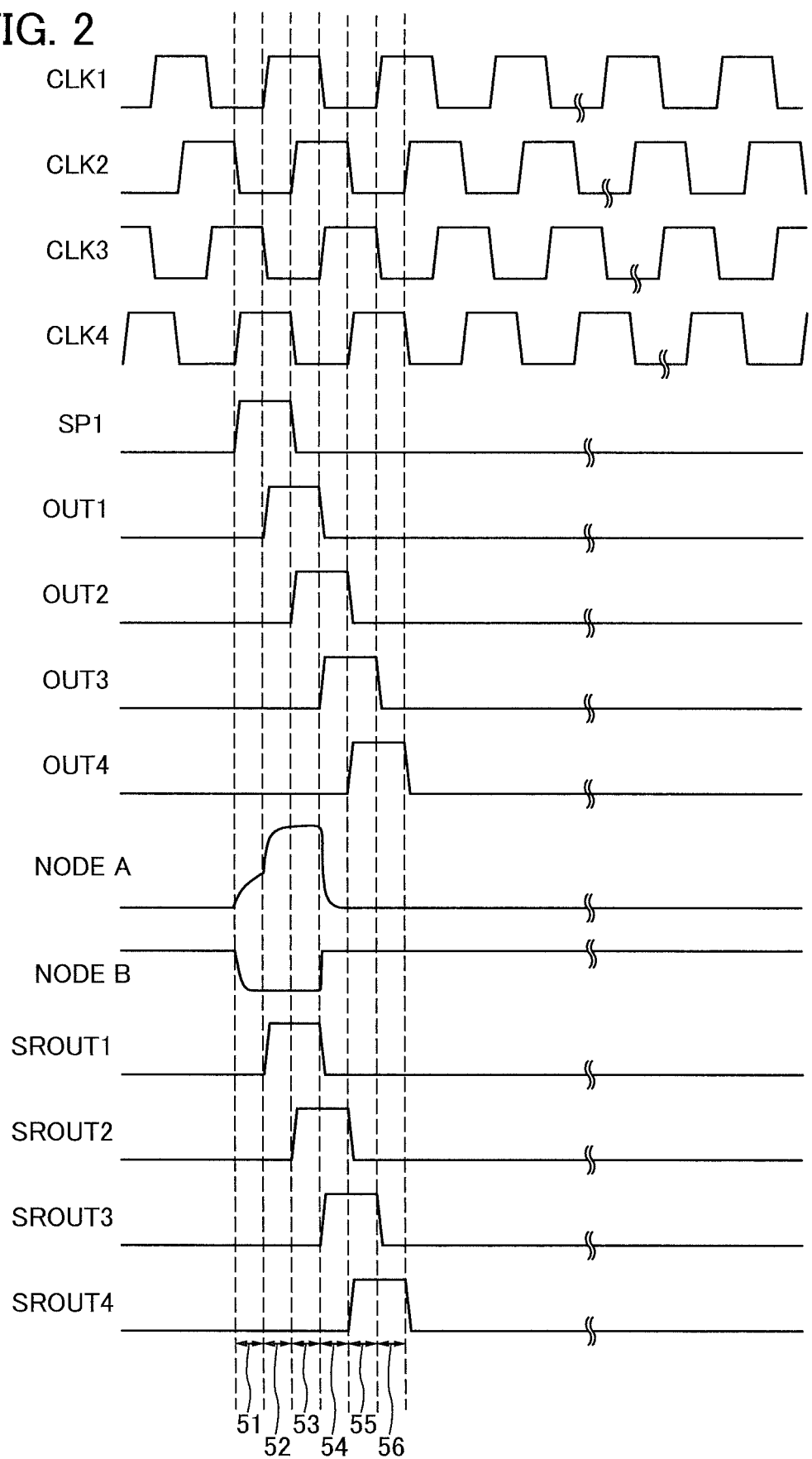
FIG. 2 is a timing chart of a shift register.
Figure 3A:
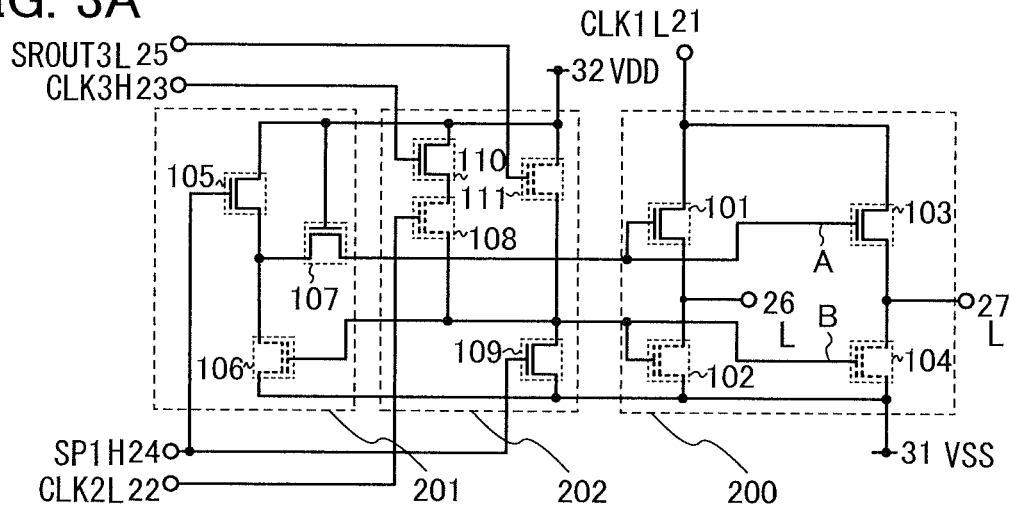
FIGS. 3A to 3C show operation of a pulse signal output circuit.
Figure 3B:
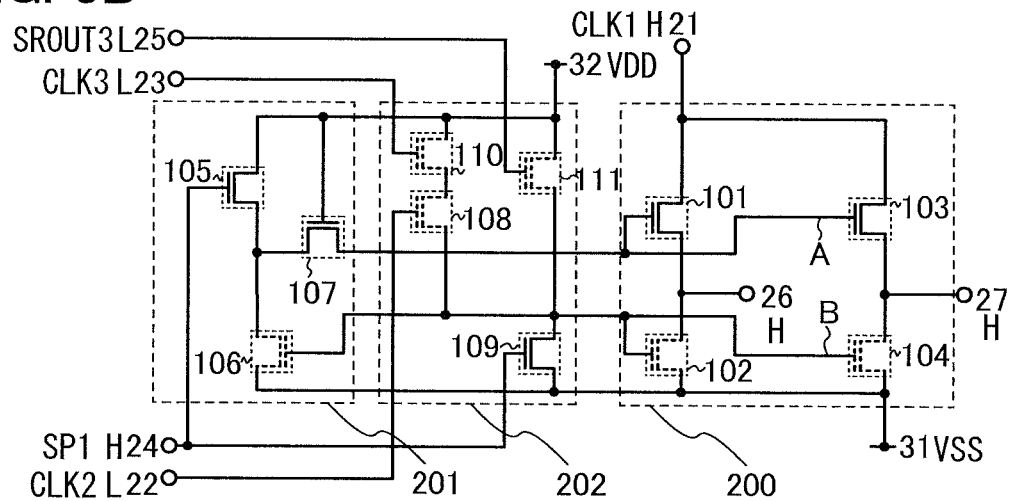
Figure 3C:
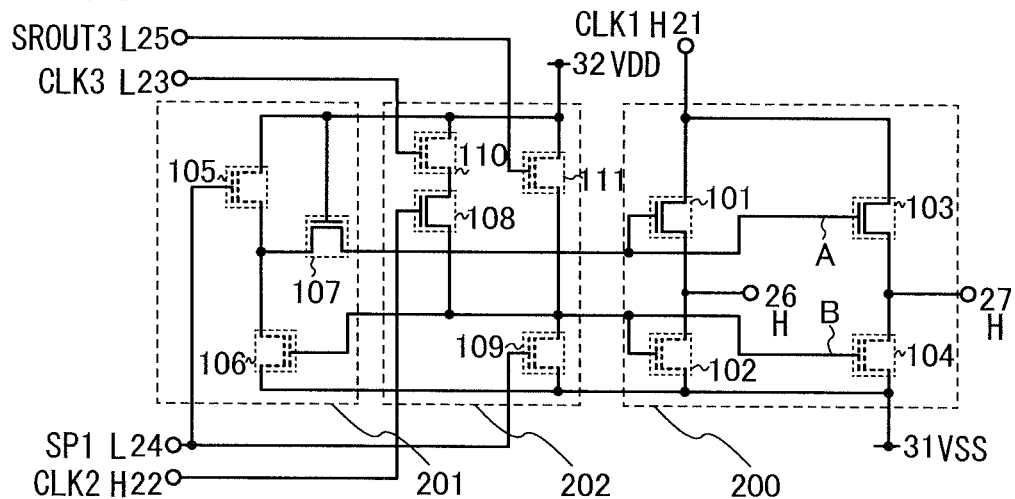
Figure 4A:
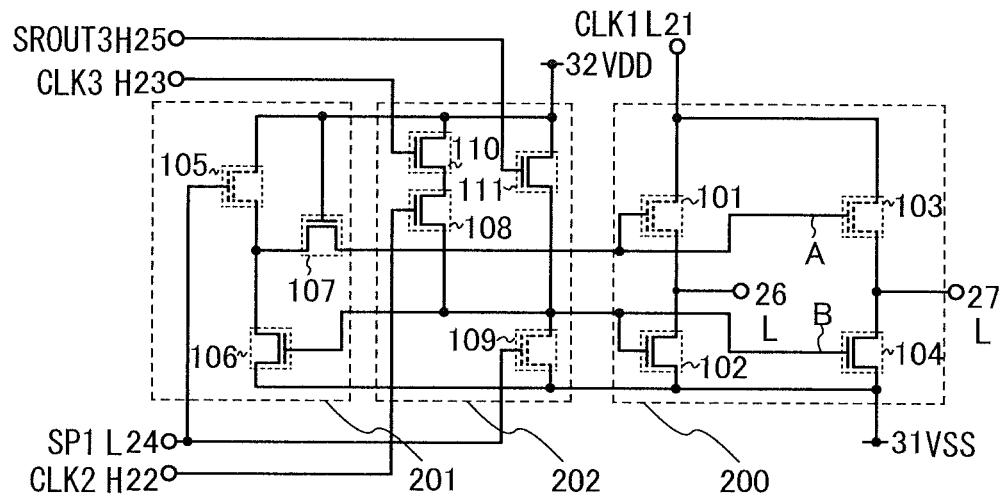
FIGS. 4A to 4C show operation of a pulse signal output circuit.
Figure 4B:
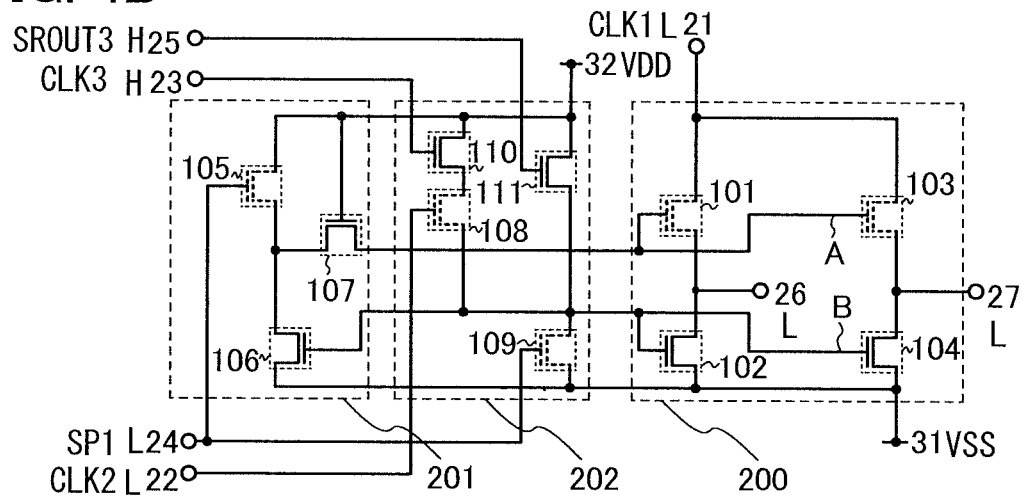
Figure 4C:
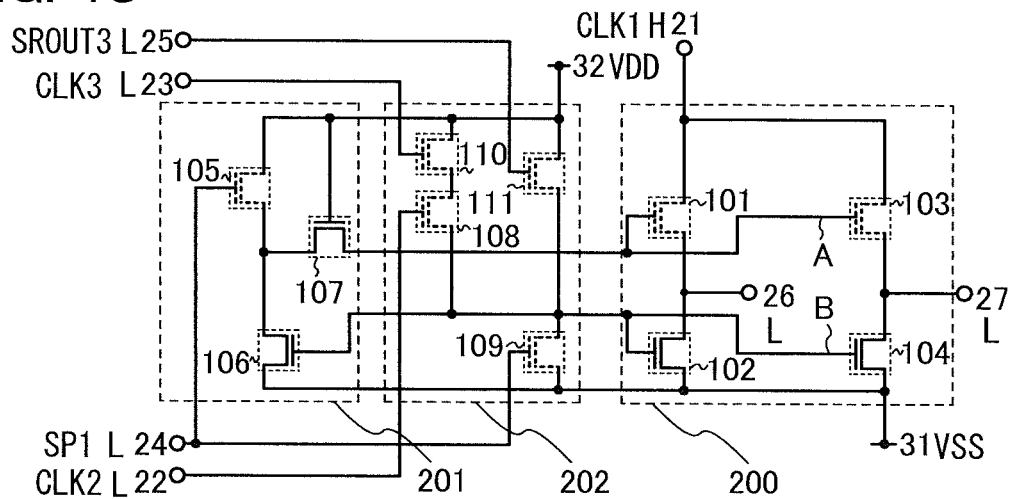

Next, operation of the shift register in FIGS. 1A to 1C is described with reference to FIG. 2, FIGS. 3A to 3C, FIGS. 4A to 4C, and FIG. 14. Specifically, operation in each of first to sixth periods 51 to 56 in a timing chart in FIG. 2 is described with reference to FIGS. 3A to 3C and FIGS. 4A to 4C, in the timing chart, CLK1 to CLK4 denote clock signals; SP1 denotes a first start pulse; OUT1 to OUT4 denote outputs from the second output terminals of the first to fourth pulse signal output circuits $10_{-1}$ to $10_{-4}$; node A and node B denote potentials of the node A and the node B; and SROUT1 to SROUT4 denote outputs from the first output terminals of the first to fourth pulse signal output circuits $10_{-1}$ to $10_{-4}$.

Note that in the following description, the first to eleventh transistors 101 to 111 are all n-channel transistors. Further, in FIGS. 3A to 3C and FIGS. 4A to 4C, transistors indicated by solid lines mean that the transistors are in a conduction state (on), and transistors indicated by dashed lines mean that the transistors are in a non-conduction state (off).

Typically, the operation of the first pulse signal output circuit $10_{-1}$ is described. The configuration of the first pulse signal output circuit $10_{-1}$ is as described above. Further, the relation among input signals and supplied potentials is also as described above. Note that in the following description, $V_{DD}$ is used for all the high potentials (also referred to as H levels, H-level signals, or the like) to be supplied to input terminals and power supply lines, and $V_{SS}$ is used for all the low potentials (also referred to as L levels, L-level signals, or the like) to be supplied to input terminals and power supply lines.

In the first period 51, SP1 is at H level, so that a high potential is supplied to the gate terminal of the fifth transistor 105 and the gate terminal of the ninth transistor 109 which function as the fourth input terminal 24 in the first pulse signal output circuit $10_{-1}$. Thus, the fifth transistor 105 and the ninth transistor 109 are turned on. In the first period 51, CLK3 is also at H level, so that the tenth transistor 110 is also turned on. In addition, since a high potential is supplied to the gate terminal of the seventh transistor 107, the seventh transistor 107 is also turned on (see FIG. 3A).

When the fifth transistor 105 and the seventh transistor 107 are turned on, the potential of the node A is increased. When the ninth transistor 109 is turned on, the potential of the node B is decreased. The potential of the second terminal of the fifth transistor 105 is $V_{DD}$. Therefore, the potential of the first terminal of the fifth transistor 105 becomes $V_{DD}-V_{th105}$, which is a potential obtained by subtracting the threshold voltage of the fifth transistor 105 from the potential of the second terminal. The potential of the gate terminal of the seventh transistor 107 is $V_{DD}$. Therefore, in the case where $V_{th107}$, which is the threshold voltage of the seventh transistor 107, is higher than or equal to $V_{th105}$, the potential of the node A becomes $V_{DD}-V_{th107}$, whereby the seventh transistor 107 is turned off. On the other hand, in the case where $V_{th107}$ is lower than $V_{th105}$, the potential of the node A is increased to $V_{DD}-V_{th105}$ while the seventh transistor 107 is kept on. Hereinafter, a mark (the highest potential) of the node A in the first period 51 is denoted by $V_{AH}$.

When the potential of the node A becomes $V_{AH}$, the first transistor 101 and the third transistor 103 are turned on. Here, since CLK1 is at L level, an L-level signal is output from the first output terminal 26 and the second output terminal 27.

In the second period 52, the potential of CLK1 is changed from L level to H level. Since the first transistor 101 and the third transistor 103 are on, the potential of the first output terminal 26 and the potential of the second output terminal 27 are increased. Further, a capacitance is generated between the gate terminal and the source terminal (or the drain terminal) of the first transistor 101; with the capacitance, the gate terminal and the source terminal (or the drain terminal) thereof are capacitively coupled. Similarly, a capacitance is generated between the gate terminal and the source terminal (or the drain terminal) of the third transistor 103; with the capacitance, the gate terminal and the source terminal (or the drain terminal) thereof are capacitively coupled. Thus, the potential of the node A in a floating state is increased as the potential of the first output terminal 26 and the potential of the second output terminal 27 are increased (bootstrap operation). The potential of the node A finally becomes higher than $V_{DD}+V_{th101}$, and each of the potential of the first output terminal 26 and the potential of the second output terminal 27 becomes $V_{DD}$ (H level) (see FIG. 2 and FIG. 3B).

In the second period 52, the ninth transistor 109 is in an on state; therefore, the node B is kept at L level. Thus, variation in the potential of the node B due to capacitive coupling, which occurs when the potential of the first output terminal 26 is changed from L level to H level, can be suppressed, so that a malfunction due to the variation in the potential can be prevented.

As described above, in the second period 52, in the case where the potential of the second output terminal 27 is at H level, a gate voltage ($V_{gs}$) of the third transistor 103 needs to be sufficiently high for turning on the third transistor 103 in order to surely increase the potential of the second output terminal 27 to $V_{DD}$ (H level). In the case where $V_{gs}$ of the third transistor 103 is low, a drain current of the third transistor 103 is small, so that it takes a long time to increase the potential of the second output terminal 27 to $V_{DD}$ (H level) in the specified period (here, in the second period). Accordingly, rising of a waveform of the second output terminal 27 becomes gentle, which leads to a malfunction.

Note that $V_{gs}$ of the third transistor 103 in the second period 52 depends on the potential of the node A in the first period 51. Therefore, in order to increase $V_{gs}$ of the third transistor 103, the potential of the node A should be as high as possible in the first period 51 (the maximum value is $V_{DD}-V_{th105}$ or $V_{DD}-V_{th107}$ in consideration of the circuit design). The same can be said also for the first output terminal 26 and $V_{gs}$ of the first transistor 101.

Therefore, the ratio W/L of the channel width W to the channel length L of the fifth transistor 105 is preferably larger than the ratio W/L of the channel width W to the channel length L of the sixth transistor 106. When the ratio W/L of the channel width W to the channel length L of the fifth transistor 105 is larger than the ratio W/L of the channel width W to the channel length L of the sixth transistor 106, the potential of the node A in the first period 51 can be increased to $V_{DD}-V_{th105}$ or $V_{DD}-V_{th107}$ in a shorter time. Note that in the first period 51, the sixth transistor 106 is in an off state. When the ratio W/L of the channel width W to the channel length L of the fifth transistor 105 is made larger than the ratio W/L of the channel width W to the channel length L of the sixth transistor 106, leakage current ($I_{off}$) in the sixth transistor 106 can be small, and thus the potential of the node A can be increased to $V_{DD}-V_{th105}$ in a shorter time.

When the channel length L becomes short due to miniaturization of the transistor, the threshold voltage shifts and the sixth transistor 106 functions as a normally-on transistor in some cases. Even in such a case, when the ratio W/L of the channel width W to the channel length L of the sixth transistor 106 is made smaller than the ratio W/L of the channel width W to the channel length L of the fifth transistor 105, the on resistance of the sixth transistor 106 can be larger than the on resistance of the fifth transistor 105. Accordingly, the potential of the node A can be made to be a potential close to $V_{DD}-V_{th105}$ or $V_{DD}-V_{th107}$.

The ratio WL of the channel width W to the channel length L of the fifth transistor 105 is preferably almost equal to the ratio W/L of the channel width W to the channel length L of the seventh transistor 107. The expression "almost equal" can be used in the case where it would be understood that two objects had the same value in consideration of a slight difference due to an error in manufacturing or variation. When the ratio W/L of the channel width W to the channel length L of the fifth transistor 105 and the ratio W/L of the channel width W to the channel length L of the seventh transistor 107 are equal to each other, the current supply capability of the fifth transistor 105 and that of the seventh transistor 107 can be equal to each other; thus, the potential of the node A can be efficiently increased. Note that the threshold voltage $V_{th}$ of the fifth transistor 105 and that of the seventh transistor 107 are preferably almost equal to each other.

Note that the ratio W/L of the channel width W to the channel length L of the fifth transistor 105 can be determined depending on the transistor characteristics, the clock frequency, the gate capacitance of the first transistor 101, the gate capacitance of the third transistor 103, the operating voltage of the shift register, or the like.

When the channel width W of the sixth transistor 106 is large, leakage current is increased in the case where the sixth transistor 106 functions as a normally-on transistor; accordingly, the potential of the node A is decreased. Further, charge of the node A by the fifth transistor 105 is prevented. In the case where high-speed operation is required, the potential of the node B needs to be decreased in a short time in order to charge the node A. In such a case, the potential of the sixth transistor needs to be decreased in a short time.

Therefore, when the channel width W of the sixth transistor is smaller than that of the fifth transistor, a change in potential of the node A can be prevented. Further, a load of the node B can be reduced. In such a manner, the sizes of the fifth transistor 105, the sixth transistor 106, and the seventh transistor 107 are determined in consideration of the transistor characteristics and the driving specification, whereby a shift register with high efficiency can be realized.

In the third period 53, SP1 becomes L level, so that the fifth transistor 105 and the ninth transistor 109 are turned off. Further, CLK1 is kept at H level and the potential of the node A is not changed; thus, $V_{DD}$ (a H-level signal) is output from the first output terminal 26 and the second output terminal 27 (see FIG. 3C). Note that in the third period 53, although the node B is in a floating state, the potential of the first output terminal 26 is not changed; therefore, a malfunction due to the capacitive coupling is negligible.

In the fourth period 54, since both CLK2 and CLK3 are at H level, the potential of the node B is increased in a short time. Further, CLK1 becomes L level. Consequently, the second transistor 102 and the fourth transistor 104 are turned on, so that the potentials of the first output terminal 26 and the second output terminal 27 are decreased in a short time (see FIG. 4A). Further, the sixth transistor 106 is turned on, so that the potential of the node A becomes L level. Thus, the first transistor 101 and the third transistor 103 are turned off, whereby the potential of the first output terminal 26 and that of the second output terminal 27 become L level.

In the fourth period 54, the potential of the node A should be decreased to $V_{SS}$ before CLK1 becomes H level in the sixth period (that is, during the fourth period 54 and the fifth period 55). When the potential of the node A is not decreased to $V_{SS}$ during the fifth period 55, the potential of the node A is increased again due to the capacitive coupling between the gate and the source of the third transistor 103; thus, the first transistor 101 and the third transistor 103 are turned on, and charge flows through the first output terminal 26 and the second output terminal 27, so that a malfunction might occur.

Therefore, a relation among the first transistor 101, the third transistor 103, and the sixth transistor 106 is determined as the following formulae (1) to (7), whereby the operation malfunction due to a load is reduced and stabilization of the operation can be achieved.

$$i_{106} = \frac{(C_{101} + C_{103}) \times V_f}{t_{off}} \quad (1)$$

$$i_{106} = \frac{W_{106}}{2L_{106}} \times \mu \times Cox \times (Vgs_{106} - Vth_{106})^2 \quad (2)$$

$$\frac{1}{f_{clk}} = T = t_{CKH} + t_{CKL} \quad (3)$$

$$t_{off} = t_{CKL} - t_a \quad (4)$$

$$C_{101} = L_{101} \times W_{101} \times Cox \quad (5)$$

$$C_{103} = L_{103} \times W_{103} \times Cox \left(Cox = \frac{\varepsilon_o \times \varepsilon_r}{tox}\right) \quad (6)$$

$$V_f = (Vdd - Vth_{105}) + Vdd \quad (7)$$

In the above formulae, $t_{CKH}$ corresponds to a period during which CLK1 is at H level, that is, the second period 52 and the third period 53; $t_{CKL}$ corresponds to a period during which CLK1 is at L level, that is, the fourth period 54 and the fifth period 55; and $t_{off}$ corresponds to a time required for decreasing the potential of the node A to $V_{SS}$. That is, in $t_{CKL}$, the potential of the node A is decreased to $V_{SS}$ in $t_{off}$. $t_{off}$ is not particularly limited as long as it is spent in a period from the fourth period 54 through the fifth period 55; for example, $t_{off}$ may be spent in a fourth period 54_1, in a period from the fourth period 54_1 through a fourth period 54_3, or in a period from the fourth period 54_1 through a fourth period 54_5 (see FIG. 14). In particular, the period from the fourth period 54_1 through the fourth period 54_3 corresponding to ½ of the period from the fourth period 54 through the fifth period 55 is preferable. The reason of this is as follows: when $t_{off}$ is set too short with respect to $t_{CKL}$, the channel width W of the sixth transistor 106 needs to be set large in order to decrease the potential of the node A quickly, and in contrast, when $t_{off}$ is set long, the potential of the node A cannot be decreased to $V_{SS}$ by the time a next H-level clock signal is input and a malfunction might occur. That is, $t_{off}$ needs to be determined in consideration of the frequency of the clock signal or the like. Note that in a timing chart in FIG. 14, part of the periods (e.g., the period from the fourth period 54_1 through the fourth period 54_5) is exaggerated; however, this timing chart is not largely different from the timing chart in FIG. 2.

$C_{101}$ and $C_{103}$ denote the gate capacitance of the first transistor 101 and the gate capacitance of the third transistor 103, respectively. $V_f$ denotes the potential of the node A in the third period 53.

$i_{106}$ in the formula (2) denotes the drain current of the sixth transistor 106. With the use of this, the size (e.g., W/L)

of the sixth transistor 106 can be determined. In other words, the size of the sixth transistor 106 can be determined in consideration of the operating frequency of CLK1, the size of the first transistor 101, the size of the third transistor 103, and the potential of the node A.

For example, in the case where the operating frequency of CLK1 is high, the potential of the node A needs to be decreased quickly; thus, $t_{off}$ should be short as seen from the formula (1). Therefore, $i_{106}$ needs to be large. $W_{106}$ is calculated in accordance with $i_{106}$ from the formula (2) and can be determined.

On the other hand, in the case where the size of the first transistor 101 and the size of the third transistor 103 are small, $i_{106}$ may be small; thus, $W_{106}$ becomes small from the formula (2). Note that since the third transistor 103 is used for charge and discharge of an output load, at the time of discharge, not only the fourth transistor 104 but also the third transistor 103 can be discharged by increasing the size of the third transistor. Accordingly, the output potential can be decreased in a short time. Therefore, when the potential of the node A is gradually decreased, the output potential can be decreased in a short time as compared with that in the case where only the fourth transistor 104 is discharged, because the third transistor 103 is in an on state. In such a manner, the size of the sixth transistor 106 is determined in consideration of the transistor characteristics and the driving specification, whereby a shift register with high efficiency can be realized.

In the fourth period 54, the potential of CLK1 is changed from H level to L level, and at the same time, a pulse signal (SROUT3) is input to the fifth input terminal 25. Accordingly, the eleventh transistor 111 is turned on. Since the eleventh transistor 111 is turned on, the potential of the node B is increased to $V_{DD}-V_{th111}$. Thus, the second transistor 102, the fourth transistor 104, and the sixth transistor 106 are turned on. When the second transistor 102 and the fourth transistor 104 are turned on, the potential of the first output terminal 26 and that of the second output terminal 27 become $V_{SS}$. Note that the first transistor 101 and the third transistor 103 are turned off.

At this time, the node B is charged through the tenth transistor 110 and the eighth transistor 108 in addition to the eleventh transistor 111. The gate of the tenth transistor 110 and the gate of the eighth transistor 108 are connected to the third input terminal 23 and the second input terminal 22, respectively, and the gate capacitance of the tenth transistor 110 and the gate capacitance of the eighth transistor 108 correspond to the load of the third input terminal 23 and the load of the second input terminal 22, respectively.

Note that in the shift register described in this embodiment, loads of the transistors connected to a clock line are expressed as "the total number of the stages of the shift register÷4×($L_{ov}$ of the third transistor 103+$L_{ov}$ of the first transistor 101+the gate capacitance of the tenth transistor 110+the gate capacitance of the eighth transistor 108)". Note that the gate capacitance is expressed as "$\varepsilon_0 \times \varepsilon \times (L \times W)/tox$". Note that $L_{ov}$ represents the length of a region where a source electrode layer or a drain electrode layer of a transistor overlaps with a semiconductor layer in a channel length direction.

In order to reduce the gate capacitance connected to the clock line, the channel width W of the eighth transistor 108 and the channel width W of the tenth transistor 110 are each preferably smaller than the channel width W of the eleventh transistor 111. With such a structure, the load of the clock line can be reduced, whereby the high-speed operation can be realized. When the channel width W of the tenth transistor 110 and that of the eighth transistor 108 are reduced, a reduction in layout area can be achieved.

In the fifth period 55, the potential of the fifth input terminal 25 (i.e., SROUT3) is kept at H level, whereby the potential of the node B is held. Thus, the second transistor 102, the fourth transistor 104, and the sixth transistor 106 are kept on, so that the potentials of the first output terminal 26 and the second output terminal 27 are kept at L level (see FIG. 4B).

In the sixth period 56, the fifth input terminal 25 (i.e., SROUT3) becomes L level, so that the eleventh transistor 111 is turned off. At this time, the node B is made to be in a floating state while keeping the potential. Thus, the second transistor 102, the fourth transistor 104, and the sixth transistor 106 are kept on (see FIG. 4C). Note that in general, the potential of the node B is decreased due to the off-state current of a transistor, for example. However, a transistor with a sufficiently low off-state current (e.g., a transistor including an oxide semiconductor) does not have such a problem. Note that a capacitor may be provided in order to reduce a decrease in potential of the node B.

In the case where both CLK2 and CLK3 become H level in a subsequent period, the eighth transistor 108 and the tenth transistor 110 are turned on, and a potential is supplied to the node B periodically. Therefore, even when a transistor whose off-state current is relatively large is used, a malfunction of the pulse signal output circuit can be prevented.

Note that as for the outputs (such as OUT1 to OUT4) from the shift register, there are the case where the time when the potential is increased is valued and the case where the time when the potential is decreased is valued. For example, in the case where data is determined by a potential increase (e.g., when data is written), the time when the potential is increased is valued. In the case where data is determined by a potential decrease, the time when the potential is decreased is valued.

In the case where data is determined by the potential increase, the time required for increasing the potential needs to be short. For that purpose, the ratio W/L of the channel width W to the channel length L of the third transistor 103 is preferably larger than the ratio W/L of the channel width W to the channel length L of the fourth transistor 104.

In the case where data is determined by the potential decrease, the time required for decreasing the potential needs to be short. For that purpose, the ratio W/L of the channel width W to the channel length L of the third transistor 103 is preferably larger than the ratio W/L of the channel width W to the channel length L of the fourth transistor 104.

Note that in one embodiment of the disclosed invention, the potential of the node A is increased to a predetermined potential by bootstrap operation that utilizes the capacitive coupling between the gate and the source of the third transistor 103. Accordingly, the third transistor 103 is turned on, and an H-level signal is output. Therefore, a problem might arise in that an H-level potential output from the shift register is not increased to $V_{DD}$ when the ratio W/L of the channel width W to the channel length L of the third transistor 103 is not sufficiently large. Thus, it is preferable that the ratio W/L of the channel width W to the channel length L of the third transistor 103 be sufficiently large.

In addition, the shift register of this embodiment is driven by a driving method in which a pulse output from the m-th pulse signal output circuit overlaps with half of a pulse output from the (m+1)-th pulse signal output circuit. Therefore, a wiring can be charged for a longer time as compared to that in the case where the driving method is not used. That is to say, with the driving method, a pulse signal output circuit which withstands a heavy load and operates at high frequency is provided.

Embodiment 2

In this embodiment, configuration examples of a pulse signal output circuit and a shift register which are different modes from the pulse signal output circuit and the shift register described in the above embodiment and operation thereof will be described with reference to FIGS. 5A to 5C, FIG. 6, FIGS. 7A to 7C, and FIGS. 8A and 8B.

<Circuit Configuration>

First, configuration examples of a pulse signal output circuit and a shift register including the pulse signal output circuit will be described with reference to FIGS. 5A to 5C.

The configuration of the shift register described in this embodiment is similar to that of the shift register described in the above embodiment. One of differences between them is that the third input terminal 23 is not provided in the first to n-th pulse signal output circuits $10_{\_1}$ to $10_{\_n}$ (see FIGS. 5A to 5C). That is, two types of clock signals are input to one pulse signal output circuit. The other structures are similar to those in the above embodiment.

Figure 5A:
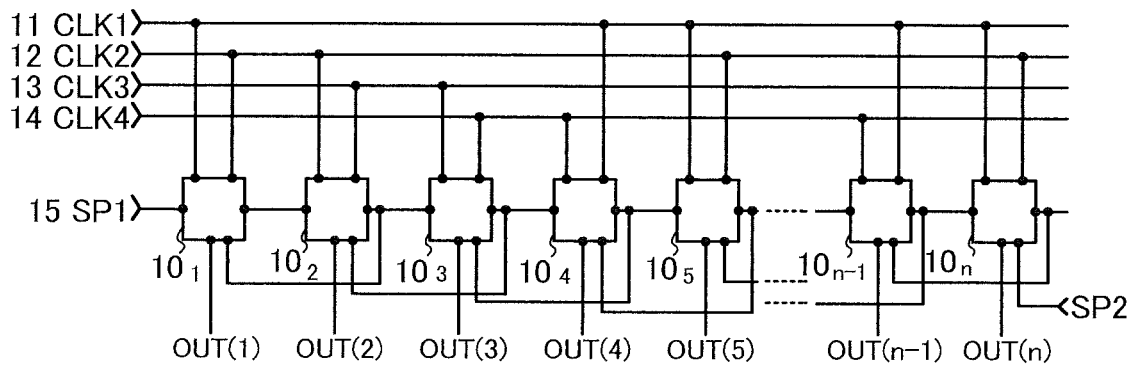
FIGS. 5A to 5C show configuration examples of a pulse signal output circuit and a shift register.
Figure 5B:
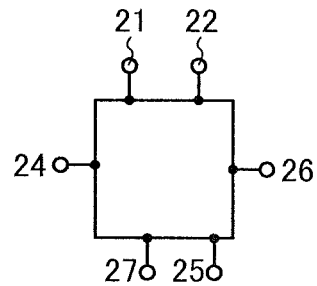
Figure 5C:
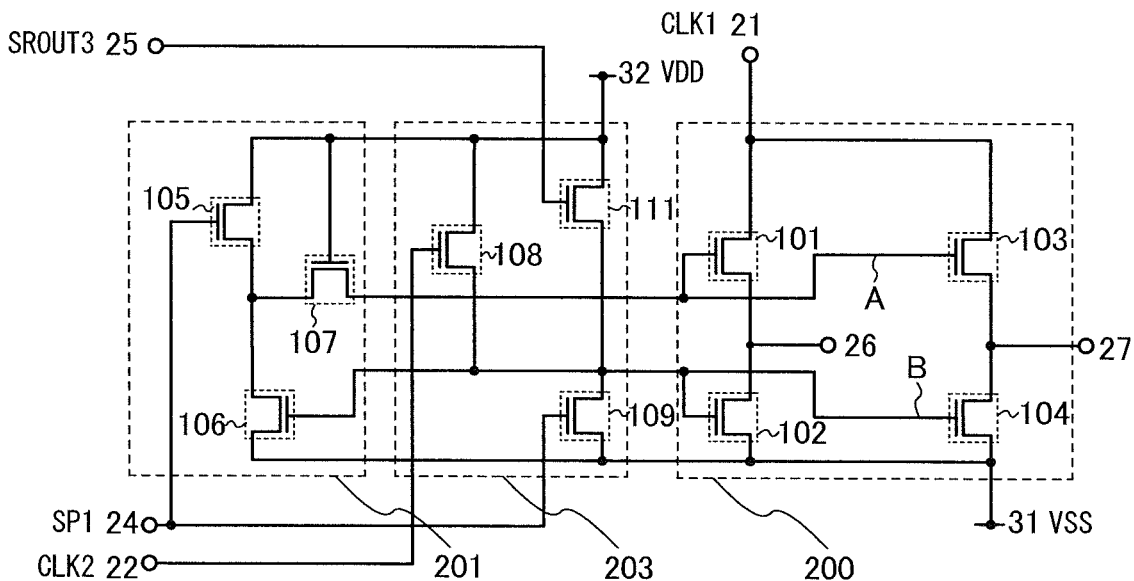

Since the third input terminal 23 is not provided in the first to n-th pulse signal output circuits $10_{\_1}$ to $10_{\_n}$, the tenth transistor connected to the third input terminal 23 is not provided (see FIG. 5C). Accordingly, the connection relation of the second input signal generation circuit 202 in FIG. 1C and the connection relation of a second input signal generation circuit 203 in FIG. 5C are partly different from each other.

Specifically, each of the first to n-th pulse signal output circuits $10_{\_1}$ to $10_{\_n}$ includes the pulse signal generation circuit 200 including the first to fourth transistors 101 to 104; the first input signal generation circuit 201 including the fifth to seventh transistors 105 to 107; and the second input signal generation circuit 203 including the eighth transistor 108, the ninth transistor 109, and the eleventh transistor 111. Signals are supplied to the first to eleventh transistors 101 to 111 from the first power supply line 31 and the second power supply line 32, in addition to the first to fifth input terminals 21 to 25.

A specific example of a configuration of the second input signal generation circuit 203 is as follows.

The second terminal of the eighth transistor 108, the second terminal of the eleventh transistor 111, and the first terminal of the ninth transistor 109 are electrically connected to one another, and function as the output terminal of the second input signal generation circuit.

The second potential is supplied to the first terminal of the eleventh transistor 111 and the first terminal of the eighth transistor 108 through the second power supply line 32. The first potential is supplied to the second terminal of the ninth transistor 109 through the first power supply line 31. A pulse signal is input to the gate terminal of the eleventh transistor 111. The gate terminal of the eleventh transistor 111 functions as the first input terminal of the second input signal generation circuit and also as the fifth input terminal 25 of the pulse signal output circuit. The second clock signal CLK2 is input to the gate terminal of the eighth transistor 108. The gate terminal of the eighth transistor 108 functions as the second input terminal of the second input signal generation circuit and also as the second input terminal 22 of the pulse signal output circuit. A pulse signal is input to the gate terminal of the ninth transistor 109. The gate terminal of the ninth transistor 109 functions as the third input terminal of the second input signal generation circuit and also as the fourth input terminal 24 of the pulse signal output circuit.

Note that the above configuration is merely one example, and the disclosed invention is not limited to this.

In the following description of this embodiment, a node where the gate terminal of the first transistor 101, the gate terminal of the third transistor 103, and the output terminal of the first input signal generation circuit are connected to one another in the pulse signal output circuit in FIG. 5C is referred to as the node A as in the above embodiment. In addition, a node where the gate terminal of the second transistor 102, the gate terminal of the fourth transistor 104, the second terminal of the eighth transistor 108, the second terminal of the eleventh transistor 111, and the first terminal of the ninth transistor 109 are connected to one another is referred to as the node B.

A capacitor for favorably performing bootstrap operation may be provided between the node A and the first output terminal 26. Furthermore, a capacitor electrically connected to the node B may be provided in order to hold the potential of the node B.

An oxide semiconductor is preferably used for the first to ninth transistors 101 to 109 and the eleventh transistor 111. With the use of an oxide semiconductor, the off-state current of the transistors can be reduced. Further, the on-state current and field-effect mobility can be increased as compared with those in the case where amorphous silicon or the like is used. Furthermore, the deterioration of the transistors can be suppressed. Consequently, an electronic circuit that consumes low power, can operate at high speed, and operates with higher accuracy is realized. Note that the description of the transistor including an oxide semiconductor is omitted here because it is described in detail in an embodiment below.

<Operation>

Figure 6:
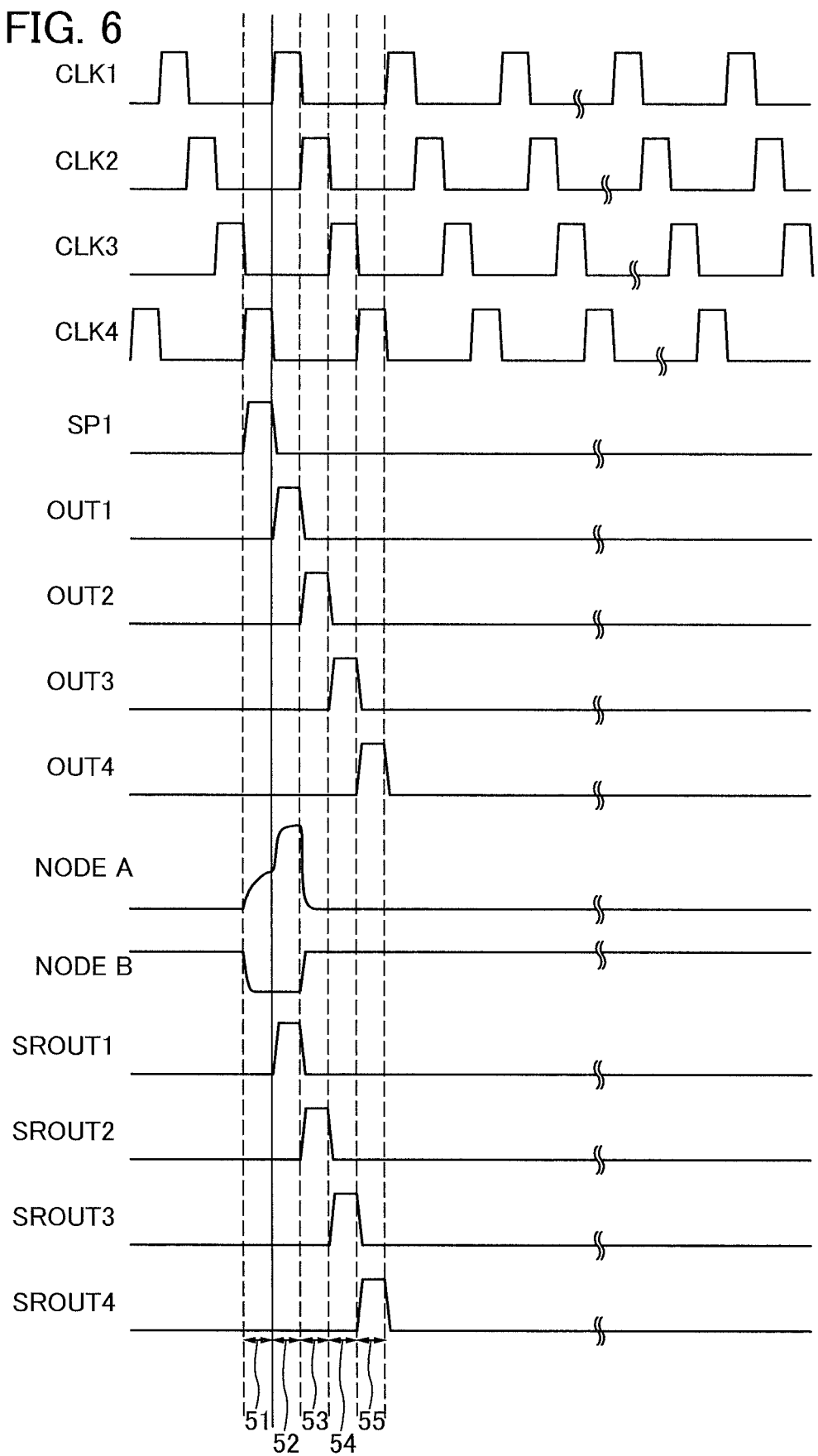
FIG. 6 is a timing chart of a shift register.
Figure 7A:
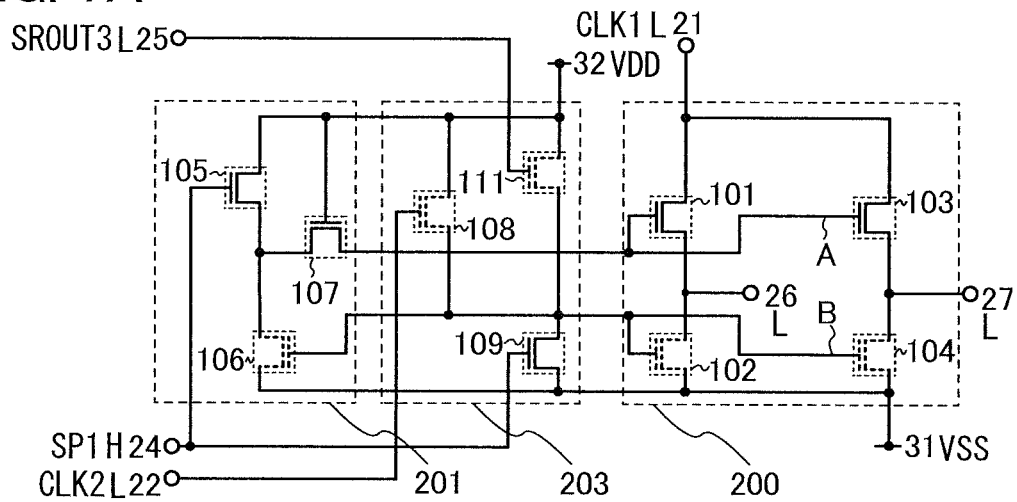
FIGS. 7A to 7C show operation of a pulse signal output circuit.
Figure 7B:
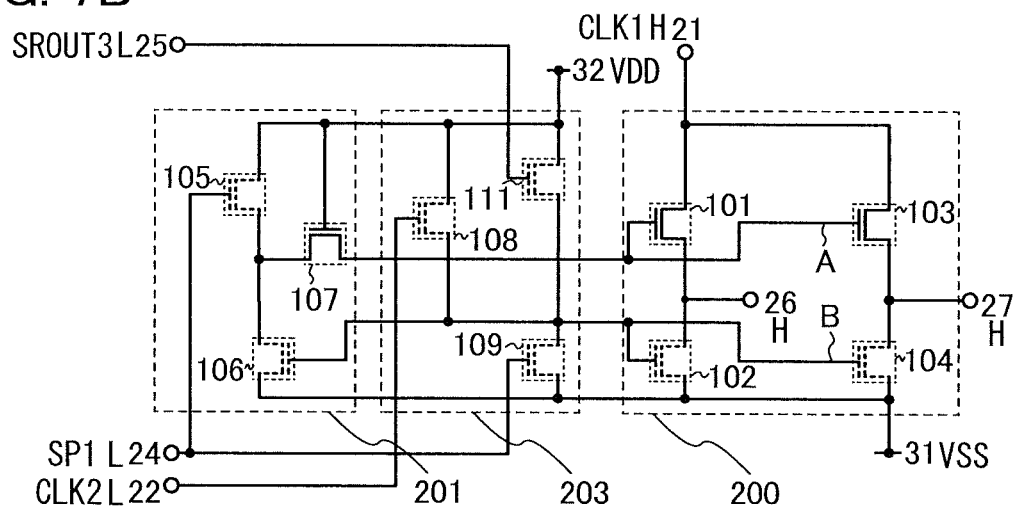
Figure 7C:
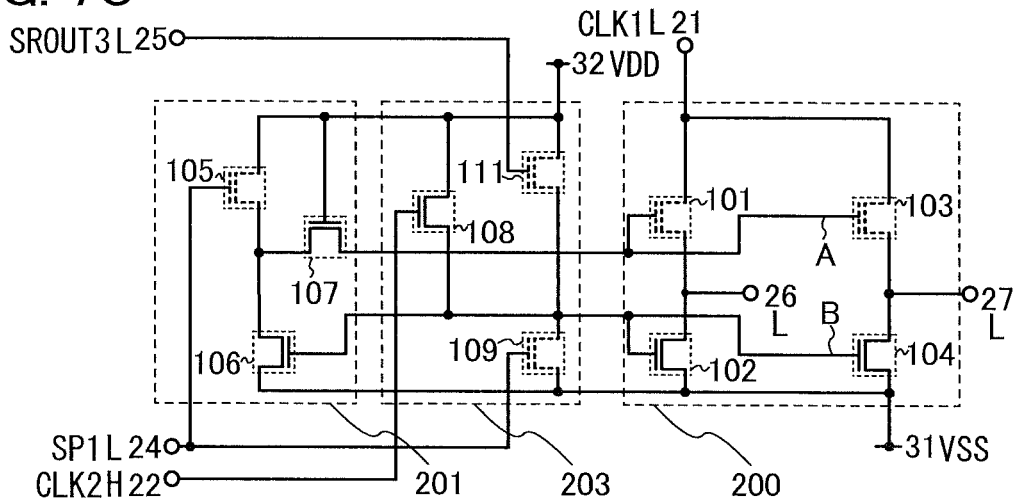
Figure 8A:
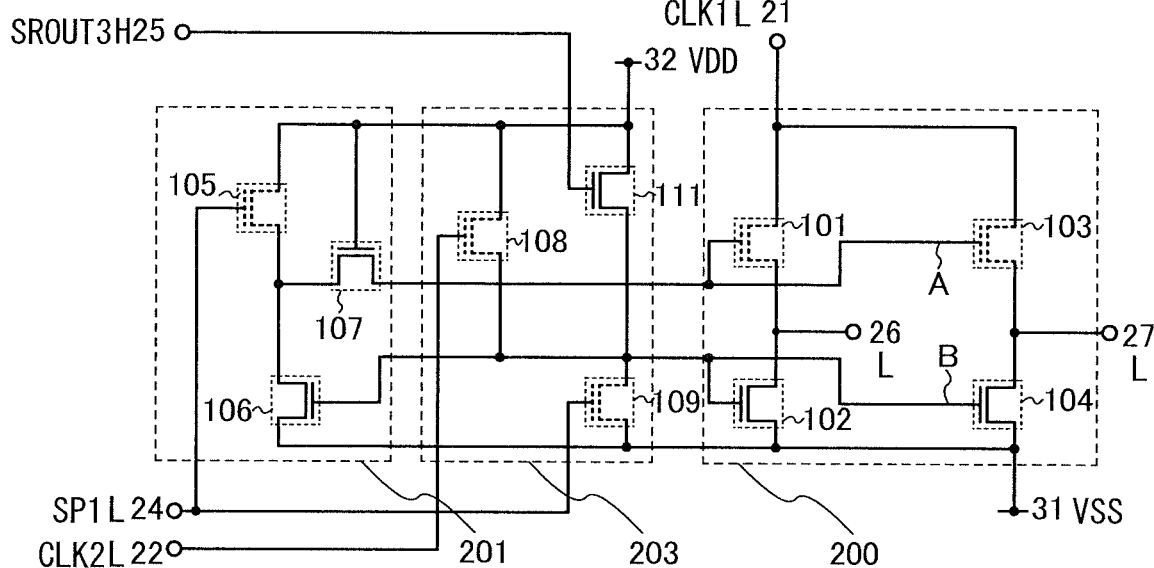
FIGS. 8A and 8B show operation of a pulse signal output circuit.
Figure 8B:
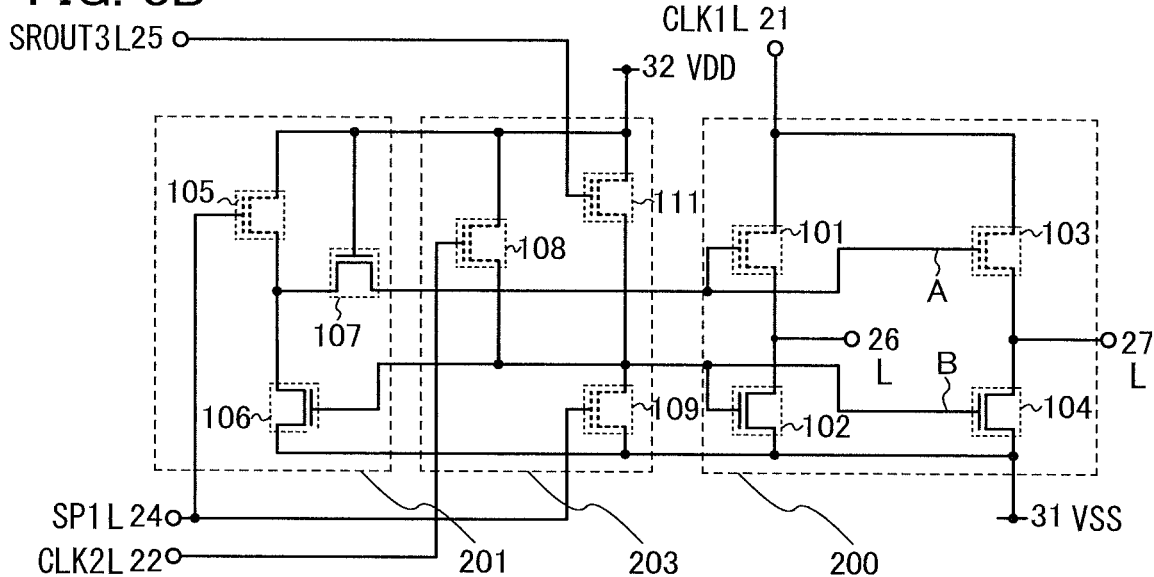

Next, operation of the shift register in FIGS. 5A to 5C is described with reference to FIG. 6, FIGS. 7A to 7C, and FIGS. 8A and 8B. Specifically, operation in each of the first to fifth periods 51 to 55 in a timing chart in FIG. 6 is described with reference to FIGS. 7A to 7C and FIGS. 8A and 8B. In the timing chart, CLK1 to CLK4 denote clock signals; SP1 denotes a first start pulse; OUT1 to OUT4 denote outputs from the second output terminals of the first to fourth pulse signal output circuits $10_{\_1}$ to $10_{\_4}$; node A and node B denote potentials of the node A and the node B; and SROUT1 to SROUT4 denote outputs from the first output terminals of the first to fourth pulse signal output circuits $10_{\_1}$ to $10_{\_4}$.

Note that in the following description, the first to ninth transistors 101 to 109 and the eleventh transistor 111 are all n-channel transistors. Further, in FIGS. 7A to 7C and FIGS. 8A and 8B, transistors indicated by solid lines mean that the transistors are in a conduction state (on), and transistors indicated by dashed lines mean that the transistors are in a non-conduction state (off).

Typically, the operation of the first pulse signal output circuit $10_{\_1}$ is described. The configuration of the first pulse signal output circuit $10_{\_1}$ is as described above. Further, the relation among input signals and supplied potentials is also as described above. Note that in the following description, $V_{DD}$ is used for all the high potentials (also referred to as H levels, H-level signals, or the like) to be supplied to input terminals and power supply lines, and $V_{SS}$ is used for all the low potentials (also referred to as L levels, L-level signals, or the like) to be supplied to input terminals and power supply lines.

In the first period 51, SP1 is at H level, so that a high potential is supplied to the gate terminal of the fifth transistor 105 and the gate terminal of the ninth transistor 109 which function as the fourth input terminal 24 in the first pulse signal output circuit $10_{-1}$. Thus, the fifth transistor 105 and the ninth transistor 109 are turned on. Since a high potential is supplied to the gate terminal of the seventh transistor 107, the seventh transistor 107 is also turned on (see FIG. 7A).

The fifth transistor 105 and the seventh transistor 107 are turned on, whereby the potential of the node A is increased. The ninth transistor 109 is turned on, whereby the potential of the node B is decreased. When the potential of the node A reaches $V_{AH}$ ($V_{AH}=V_{DD}-V_{th105}-V_{th107}$), the fifth transistor 105 and the seventh transistor 107 are turned off and the node A is brought into a floating state while keeping its potential at $V_{AH}$.

When the potential of the node A becomes $V_{AH}$, the first transistor 101 and the third transistor 103 are turned on. Here, since CLK1 is at L level, an L-level signal is output from the first output terminal 26 and the second output terminal 27.

In the second period 52, the potential of CLK1 is changed from L level to H level. Since the first transistor 101 and the third transistor 103 are on, the potential of the first output terminal 26 and the potential of the second output terminal 27 are increased. Further, a capacitance is generated between the gate terminal and the source terminal (or the drain terminal) of the first transistor 101; with the capacitance, the gate terminal and the source terminal (or the drain terminal) thereof are capacitively coupled. Similarly, a capacitance is generated between the gate terminal and the source terminal (or the drain terminal) of the third transistor 103; with the capacitance, the gate terminal and the source terminal (or the drain terminal) are capacitively coupled. Thus, the potential of the node A in a floating state is increased as the potential of the first output terminal 26 and the potential of the second output terminal 27 are increased (bootstrap operation). The potential of the node A finally becomes higher than $V_{DD}+V_{th101}$, and each of the potential of the first output terminal 26 and the potential of the second output terminal 27 becomes $V_{DD}$ (H level) (see FIG. 6 and FIG. 7B).

In the third period 53, the potential of CLK2 becomes H level, and the eighth transistor 108 is turned on. Accordingly, the potential of the node B is increased. When the potential of the node B is increased, the second transistor 102, the fourth transistor 104, and the sixth transistor 106 are turned on and the potential of the node A is decreased. Therefore, the potential of the first output terminal 26 and the potential of the second output terminal 27 become L level (see FIG. 7C).

In the fourth period 54, the potential of CLK2 becomes L level, and the eighth transistor 108 is turned off. The potential of the fifth input terminal 25 (that is, SROUT3) becomes H level, and the eleventh transistor 111 is turned on. Therefore, the potential of the node A and the potential of the node B in the third period 53 are held, and the potential of the first output terminal 26 and the potential of the second output terminal 27 are kept at L level (see FIG. 8A).

In the fifth period 55, the potential of the fifth input terminal 25 (that is, SROUT3) becomes L level, and the potential of the node B is held. Thus, the second transistor 102, the fourth transistor 104, and the sixth transistor 106 are kept on, so that the potentials of the first output terminal 26 and the second output terminal 27 are kept at L level (see FIG. 8B).

Note that in general, the potential of the node B is decreased due to the off-state current of a transistor, for example. However, a transistor with a sufficiently low off-state current (e.g., a transistor including an oxide semiconductor) does not have such a problem. In order to reduce a decrease in potential of the node B, a capacitor may be provided. The capacitor provided in this case is electrically connected to the gate terminal of the second transistor 102, the gate terminal of the fourth transistor 104, the gate terminal of the sixth transistor 106, the first terminal of the eighth transistor 108, and the first terminal of the ninth transistor 109.

In the case where the potential of CLK2 becomes H level in a subsequent period, the eighth transistor 108 is turned on, and a potential is supplied to the node B periodically. Therefore, even when a transistor whose off-state current is relatively large is employed, a malfunction of the pulse signal output circuit can be prevented.

The structures, methods, and the like described in this embodiment can be combined as appropriate with any of the structures, methods, and the like described in the other embodiments.

Embodiment 3

Figure 9A:
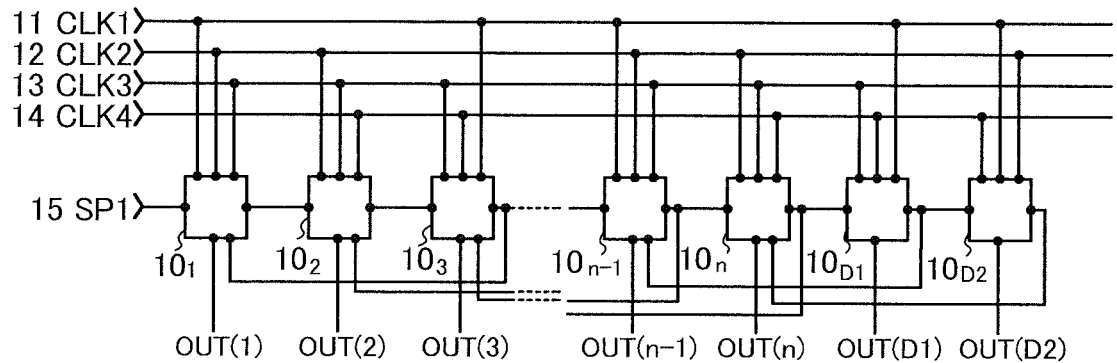
FIGS. 9A to 9C show configuration examples of a pulse signal output circuit and a shift register.
Figure 9B:
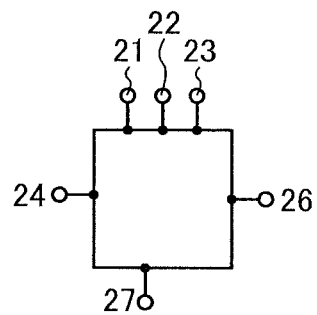
Figure 9C:
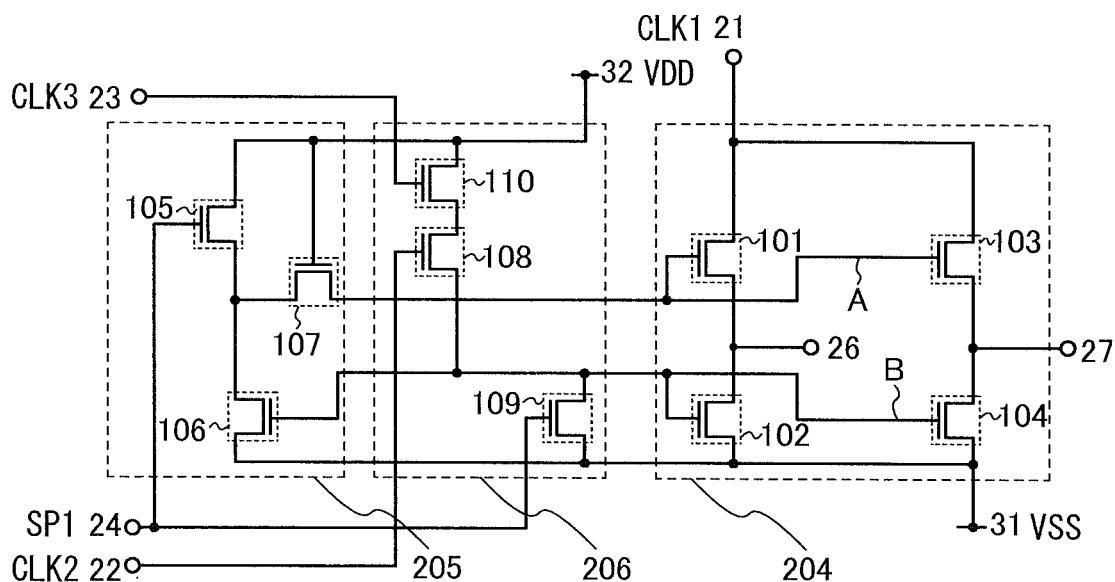

In this embodiment, configuration examples of a pulse signal output circuit and a shift register which are different modes from the pulse signal output circuit and the shift register described in any of the above embodiments will be described with reference to FIGS. 9A to 9C.

The configuration of the shift register described in this embodiment is similar to that of the shift register described in the above embodiment. One of differences between them is that a first dummy pulse signal output circuit $10_{-D1}$ and a second dummy pulse signal output circuit $10_{-D2}$ . . . m are connected to a subsequent stage of the n-th pulse signal output circuit $10_{-n}$ (see FIG. 9A). The first dummy pulse signal output circuit $10_{-D1}$ and the second dummy pulse signal output circuit $10_{-D2}$ have a function of supplying a pulse signal to the fifth input terminals 25 of the (n−1)-th and n-th pulse signal output circuits $10_{-n-1}$ and $10_{-n}$.

A pulse signal output circuit is not provided in subsequent stages of the first dummy pulse signal output circuit $10_{-D1}$ and the second dummy pulse signal output circuit $10_{-D2}$. That is, a pulse signal is not input to the first dummy pulse signal output circuit $10_{-D1}$ and the second dummy pulse signal output circuit $10_{-D2}$ from their subsequent stages (in this case, the stages following their respective next stages), which is different from the first to n-th pulse signal output circuits. Therefore, a terminal corresponding to the fifth input terminal 25 of the first to n-th pulse signal output circuits is not provided (see FIGS. 9B and 9C). Further, the eleventh transistor 111 which is related to the fifth input terminal 25 is also not provided (see FIG. 9C).

The function of the dummy pulse signal output circuits (the first and second dummy pulse signal output circuits) is to output an appropriate pulse signal to the pulse signal output circuits in normal stages (the (n−1)-th and n-th pulse signal output circuits); therefore, the dummy pulse signal output circuits need to have the ability to charge the node B sufficiently. Here, in the first to n-th pulse signal output circuits, the sizes of the eighth transistor 108 and the tenth transistor 110 are made small (for example, the channel width W is made small, or the ratio W/L of the channel width W to the channel length L is made small) so that the charging ability is ensured by the eleventh transistor 111, in order to reduce power consumption due to an input of the clock signal. On the other hand, in the dummy pulse signal output circuits, the eleventh transistor 111 is not provided; therefore, the sizes of the eighth transistor 108 and the tenth transistor 110 need to be large such that the charging ability of the eleventh transistor 111 can be compensated.

Specifically, for example, each of the channel widths W (or the ratios W/L of the channel widths W to the channel lengths L) of the eighth transistors in the first and second dummy pulse signal output circuits may be made larger than each of the channel widths W (or the ratios W/L of the channel widths W to the channel lengths L) of the eighth transistors in the first to n-th pulse signal output circuits, or each of the channel widths W (or the ratios W/L of the channel widths W to the channel lengths L) of the tenth transistors in the first and second dummy pulse signal output circuits may be made larger than each of the channel widths W (or the ratios W/L of the channel widths W to the channel lengths L) of the tenth transistors in the first to n-th pulse signal output circuits. With such a structure, power consumption in the pulse signal output circuits in the normal stages (the (n−1)-th and n-th pulse signal output circuits) can be reduced, and a shift register operating appropriately can be realized.

Note that the basic configuration of the dummy pulse signal output circuits is similar to that of the pulse signal output circuit described in the above embodiment except for the above difference. Specifically, each of the first to n-th pulse signal output circuits $10_{-1}$ to $10_{-n}$ includes a dummy pulse signal generation circuit 204 including the first to fourth transistors 101 to 104; a first input signal generation circuit 205 including the fifth to seventh transistors 105 to 107; and a second input signal generation circuit 206 including the eighth to tenth transistors 108 to 110. Signals are supplied to the first to tenth transistors 101 to 110 from the first power supply line 31 and the second power supply line 32.

The operation of the dummy pulse signal output circuits is also similar to that of the pulse signal output circuit described in the above embodiment except for the point that an output from their subsequent stages is not input. Therefore, the above embodiment can be referred to for a detailed description thereof. Note that the tenth transistor 110 is not necessarily provided. Further, in the dummy pulse signal output circuits, at least an output to the pulse signal output circuits in the normal stages (the (n−1)-th and n-th pulse signal output circuits) needs to be ensured; therefore, the number of systems of the output terminals is not limited to two, and may be one. That is, the first output terminal 26 or the second output terminal 27 can be omitted. Note that in this case, a transistor attached to the output terminal that is to be omitted (for example, in the case where the second output terminal 27 is omitted, the third transistor 103 and the fourth transistor 104) may be omitted as appropriate.

The structures, methods, and the like described in this embodiment can be combined as appropriate with any of the structures, methods, and the like described in the other embodiments.

Embodiment 4

In this embodiment, examples of transistors which can be used in the pulse signal output circuit and the shift register described in the above embodiment are described with reference to FIGS. 10A to 10D. There is no particular limitation on the structure of the transistor. For example, a staggered type or a planar type having a top-gate structure or a bottom-gate structure can be employed. Alternatively, the transistor may have a single-gate structure in which one channel formation region is formed or a multi-gate structure in which two or more channel formation regions are formed. Alternatively, the transistor may have a structure in which two gate electrode layers are formed over and below a channel region with a gate insulating layer provided therebetween.

FIGS. 10A to 10D illustrate examples of the cross-sectional structures of the transistors. The transistors illustrated in FIGS. 10A to 10D each include an oxide semiconductor as a semiconductor. An advantage of the use of an oxide semiconductor is high mobility and low off-state current which can be obtained by a simple low-temperature process.

Figure 10A:
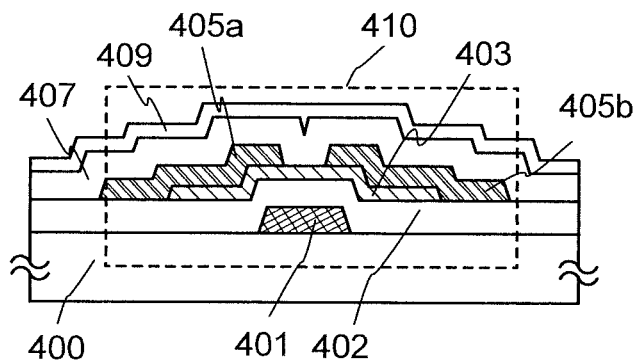
FIGS. 10A to 10D each show a structure example of a transistor.

A transistor 410 illustrated in FIG. 10A is an example of a bottom-gate transistor and is also referred to as an inverted-staggered transistor.

The transistor 410 includes a gate electrode layer 401, a gate insulating layer 402, an oxide semiconductor layer 403, a source electrode layer 405*a*, and a drain electrode layer 405*b* which are provided over a substrate 400 having an insulating surface. Further, an insulating layer 407 which is in contact with the oxide semiconductor layer 403 is provided. A protective insulating layer 409 is formed over the insulating layer 407.

Figure 10B:
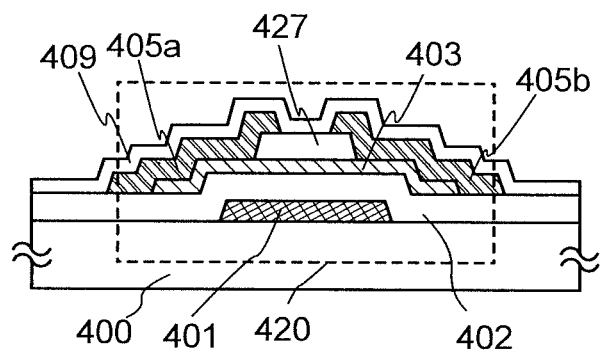

A transistor 420 illustrated in FIG. 10B is an example of a bottom-gate transistor referred to as a channel-protective (channel-stop) transistor and is also referred to as an inverted-staggered transistor.

The transistor 420 includes the gate electrode layer 401, the gate insulating layer 402, the oxide semiconductor layer 403, an insulating layer 427 functioning as a channel protective layer, the source electrode layer 405*a*, and the drain electrode layer 405*b* which are provided over the substrate 400 having an insulating surface. Further, the protective insulating layer 409 is provided.

Figure 10C:
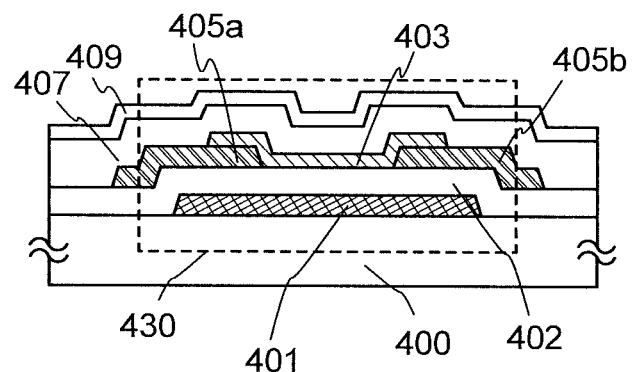

A transistor 430 illustrated in FIG. 10C is an example of a bottom-gate transistor. The transistor 430 includes the gate electrode layer 401, the gate insulating layer 402, the source electrode layer 405*a*, the drain electrode layer 405*b*, and the oxide semiconductor layer 403 which are provided over the substrate 400 having an insulating surface. Further, the insulating layer 407 which is in contact with the oxide semiconductor layer 403 is provided. Furthermore, the protective insulating layer 409 is formed over the insulating layer 407.

In the transistor 430, the gate insulating layer 402 is provided on and in contact with the substrate 400 and the gate electrode layer 401, and the source electrode layer 405*a* and the drain electrode layer 405*b* are provided on and in contact with the gate insulating layer 402. Further, the oxide semiconductor layer 403 is provided over the gate insulating layer 402, the source electrode layer 405*a*, and the drain electrode layer 405*b*.

Figure 10D:
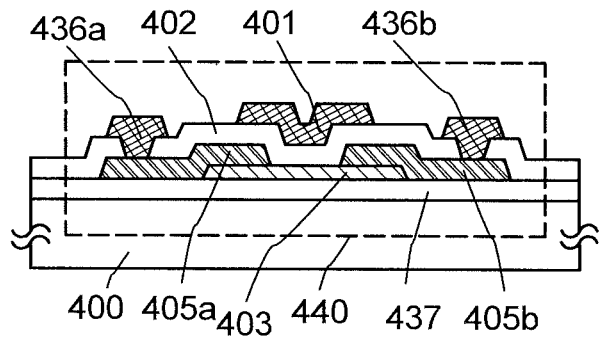

A transistor 440 illustrated in FIG. 10D is an example of a top-gate transistor. The transistor 440 includes an insulating layer 437, the oxide semiconductor layer 403, the source electrode layer 405*a*, the drain electrode layer 405*b*, the gate insulating layer 402, and the gate electrode layer 401 which are provided over the substrate 400 having an insulating surface. A wiring layer 436*a* and a wiring layer 436*b* are provided in contact with the source electrode layer 405*a* and the drain electrode layer 405*b*, respectively.

In this embodiment, as described above, the oxide semiconductor layer 403 is used as a semiconductor layer. As an oxide semiconductor used for the oxide semiconductor layer 403, a four-component metal oxide, such as an In—Sn—

Ga—Zn—O-based oxide semiconductor; a three-component metal oxide, such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide, such as an In—Zn—O-based oxide semiconductor, an In—Ga—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor; or a one-component metal oxide, such as an In—O-based oxide semiconductor, a Sn—O-based oxide semiconductor, or a Zn—O-based oxide semiconductor can be used. Further, $SiO_2$ may be added to the oxide semiconductor. Here, for example, an In—Ga—Zn—O-based oxide semiconductor is an oxide including at least In, Ga, and Zn, and there is no particular limitation on the composition ratio thereof. Furthermore, the In—Ga—Zn—O-based oxide semiconductor may contain an element other than In, Ga, and Zn.

For the oxide semiconductor layer 403, an oxide semiconductor expressed by a chemical formula of $InMO_3(ZnO)_m$ (m>0 and m is not a natural number) can be used. Here, M represents one or more metal elements selected from gallium (Ga), aluminum (Al), manganese (Mn), and cobalt (Co). For example, M can be Ga, Ga and Al, Ga and Mn, Ga and Co, or the like.

The off-state current of the transistor 410, the transistor 420, the transistor 430, and the transistor 440 including the oxide semiconductor layer 403 can be markedly reduced. Thus, when such transistors are used in the pulse signal output circuit and the shift register, the potential of each node can be held easily, so that the possibility of malfunctions of the pulse signal output circuit and the shift register can be markedly lowered.

There is no particular limitation on a substrate which can be used as the substrate 400 having an insulating surface. For example, a glass substrate, a quartz substrate, or the like used for a liquid crystal display device or the like can be used. Alternatively, a substrate where an insulating layer is formed over a silicon wafer may be used, for example.

In each of the bottom-gate transistors 410, 420, and 430, an insulating layer serving as a base may be provided between the substrate and the gate electrode layer. The insulating layer has a function of preventing diffusion of an impurity element from the substrate, and can be formed to have a single-layer structure or a stacked structure including one or more films selected from a silicon nitride film, a silicon oxide film, a silicon nitride oxide film, and a silicon oxynitride film.

The gate electrode layer 401 can be formed using a metal material such as molybdenum, titanium, chromium, tantalum, tungsten, aluminum, copper, neodymium, or scandium, or an alloy material which includes any of these materials as a main component. The gate electrode layer 401 may have a single-layer structure or a stacked structure.

The gate insulating layer 402 can be formed using one or more films selected from a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, and the like by plasma CVD, sputtering, or the like. For example, a gate insulating layer with a total thickness of about 300 nm can be formed in such a manner that a silicon nitride film ($SiN_y$ (y>0)) with a thickness of 50 nm to 200 nm is formed as a first gate insulating layer by plasma CVD and a silicon oxide film ($SiO_x$ (x>0)) with a thickness of 5 nm to 300 nm is stacked over the first gate insulating layer as a second gate insulating layer by sputtering.

The source electrode layer 405a and the drain electrode layer 405b can be formed using a metal material such as molybdenum, titanium, chromium, tantalum, tungsten, aluminum, copper, neodymium, or scandium, or an alloy material which includes any of these materials as a main component. For example, the source electrode layer 405a and the drain electrode layer 405b can have a stacked structure of a metal layer including aluminum, copper, or the like and a refractory metal layer including titanium, molybdenum, tungsten, or the like. Heat resistance may be improved with the use of an aluminum material to which an element for preventing generation of hillocks and whiskers (e.g., silicon, neodymium, or scandium) is added.

Alternatively, a conductive metal oxide film may be used as a conductive film serving as the source electrode layer 405a and the drain electrode layer 405b (including a wiring layer formed from the same layer as the source electrode layer 405a and the drain electrode layer 405b). Indium oxide ($In_2O_3$), tin oxide ($SnO_2$), zinc oxide (ZnO), an alloy of indium oxide and tin oxide ($In_2O_3$—$SnO_2$, which is abbreviated to ITO in some cases), an alloy of indium oxide and zinc oxide ($In_2O_3$—ZnO), any of these metal oxide materials including silicon oxide, or the like can be used as a conductive metal oxide.

The wiring layer 436a and the wiring layer 436b which are in contact with the source electrode layer 405a and the drain electrode layer 405b, respectively, can be formed using a material which is similar to that of the source electrode layer 405a and the drain electrode layer 405b.

For each of the insulating layers 407, 427, and 437, an inorganic insulating film such as a silicon oxide film, a silicon oxynitride film, an aluminum oxide film, or an aluminum oxynitride film can be used typically.

For the protective insulating layer 409, an inorganic insulating film such as a silicon nitride film, an aluminum nitride film, a silicon nitride oxide film, or an aluminum nitride oxide film can be used.

In addition, a planarization insulating film for reducing surface unevenness due to the transistor may be formed over the protective insulating layer 409. For the planarization insulating film, an organic material such as polyimide, acrylic, or benzocyclobutene can be used. As an alternative to such an organic material, a low-dielectric constant material (a low-k material) or the like can be used. Note that the planarization insulating film may be formed by stacking a plurality of insulating films including these materials.

The structures, methods, and the like described in this embodiment can be combined as appropriate with any of the structures, methods, and the like described in the other embodiments.

Embodiment 5

In this embodiment, an example of a transistor including an oxide semiconductor layer and an example of a manufacturing method thereof will be described in detail with reference to FIGS. 11A to 11E.

FIGS. 11A to 11E are cross-sectional views illustrating a manufacturing process of a transistor. A transistor 510 illustrated here is an inverted-staggered transistor similar to the transistor 410 illustrated in FIG. 10A.

An oxide semiconductor used for a semiconductor layer of this embodiment is an i-type (intrinsic) oxide semiconductor or a substantially i-type (intrinsic) oxide semiconductor. The i-type (intrinsic) oxide semiconductor or substantially i-type (intrinsic) oxide semiconductor is obtained in such a manner that hydrogen, which is an n-type impurity, is removed from an oxide semiconductor, and the oxide semiconductor is purified so as to contain as few impurities that are not main components of the oxide semiconductor as possible.

Note that the purified oxide semiconductor includes extremely few carriers, and the carrier concentration is lower than $1\times10^{14}/cm^3$, preferably lower than $1\times10^{12}/cm^3$, further preferably lower than $1\times10^{11}/cm^3$. Such few carriers enable a current in an off state (off-state current) to be small enough.

Specifically, in the transistor including the above-described oxide semiconductor layer, the off-state current density per channel width of 1 μm at room temperature (25° C.) can be 100 zA/μm ($1\times10^{-19}$ A/μm) or lower, or further 10 zA/μm ($1\times10^{-20}$ A/μm) or lower under conditions where the channel length L of the transistor is 10 μm and the source-drain voltage is 3 V.

The transistor 510 including the purified oxide semiconductor layer hardly has temperature dependence of an on-state current and also has an extremely small off-state current.

A process for manufacturing the transistor 510 over a substrate 505 will be described with reference to FIGS. 11A to 11E.

First, a conductive film is formed over the substrate 505 having an insulating surface, and then a gate electrode layer 511 is formed through a first photolithography process. Note that a resist mask used in the photolithography process may be formed by an inkjet method. Formation of the resist mask by an inkjet method needs no photomask; thus, manufacturing cost can be reduced.

As the substrate 505 having an insulating surface, a substrate similar to the substrate 400 described in the above embodiment can be used. In this embodiment, a glass substrate is used as the substrate 505.

An insulating layer serving as a base may be provided between the substrate 505 and the gate electrode layer 511. The insulating layer has a function of preventing diffusion of an impurity element from the substrate 505, and can be formed of one or more films selected from a silicon nitride film, a silicon oxide film, a silicon nitride oxide film, a silicon oxynitride film, and the like.

The gate electrode layer 511 can be formed using a metal material such as molybdenum, titanium, chromium, tantalum, tungsten, aluminum, copper, neodymium, or scandium, or an alloy material which includes any of these metal materials as a main component. The gate electrode layer 511 can have a single-layer structure or a stacked structure.

Next, a gate insulating layer 507 is formed over the gate electrode layer 511. The gate insulating layer 507 can be formed by a plasma CVD method, a sputtering method, or the like. The gate insulating layer 507 can be formed of one or more films selected from a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, and the like.

Further, in order that hydrogen, hydroxyl, and moisture are contained as little as possible in the gate insulating layer 507 and an oxide semiconductor film 530, it is preferable to preheat the substrate 505 over which the gate electrode layer 511 is formed or the substrate 505 over which the gate electrode layer 511 and the gate insulating layer 507 are formed, in a preheating chamber of a sputtering apparatus as pretreatment for the formation of the oxide semiconductor film 530, so that impurities such as hydrogen and moisture adsorbed on the substrate 505 are eliminated. As an evacuation unit, a cryopump is preferably provided for the preheating chamber. This preheating step may be performed on the substrate 505 over which layers up to and including a source electrode layer 515a and a drain electrode layer 515b are formed. Note that this preheating treatment can be omitted.

Figure 11A:
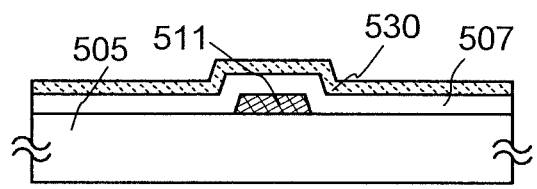
FIGS. 11A to 11E show an example of a method for manufacturing a transistor.

Next, over the gate insulating layer 507, the oxide semiconductor film 530 with a thickness of greater than or equal to 2 nm and less than or equal to 200 nm, preferably greater than or equal to 5 nm and less than or equal to 30 nm is formed (see FIG. 11A).

For the oxide semiconductor film 530, any of the four-component metal oxide, the three-component metal oxides, the two-component metal oxides, an In—O-based oxide semiconductor, a Sn—O-based oxide semiconductor, a Zn—O-based oxide semiconductor, and the like, which are described in the above embodiment, can be used.

As a target for forming the oxide semiconductor film 530 by a sputtering method, it is particularly preferable to use a target having a composition ratio of In:Ga:Zn=1:x:y (x is greater than or equal to 0 and y is greater than or equal to 0.5 and less than or equal to 5). For example, a target having a composition ratio of $In_2O_3:Ga_2O_3:ZnO=1:1:2$ [molar ratio] can be used. Alternatively, a target having a composition ratio of $In_2O_3:Ga_2O_3:ZnO=1:1:1$ [molar ratio], a target having a composition ratio of $In_2O_3:Ga_2O_3:ZnO=1:1:4$ [molar ratio], or a target having a composition ratio of $In_2O_3:Ga_2O_3:ZnO=1:0:2$ [molar ratio] can be used.

In this embodiment, an oxide semiconductor layer having an amorphous structure is formed by a sputtering method using an In—Ga—Zn—O-based metal oxide target.

The relative density of a metal oxide in the metal oxide target is greater than or equal to 80%, preferably greater than or equal to 95%, and further preferably greater than or equal to 99.9%. The use of a metal oxide target having high relative density makes it possible to form an oxide semiconductor layer with a dense structure.

The atmosphere in which the oxide semiconductor film 530 is formed is preferably a rare gas (typically, argon) atmosphere, an oxygen atmosphere, or a mixed atmosphere containing a rare gas (typically, argon) and oxygen. Specifically, it is preferable to use, for example, an atmosphere of a high-purity gas from which an impurity such as hydrogen, water, hydroxyl, or hydride is removed so that the impurity concentration is 1 ppm or lower (preferably the impurity concentration is 10 ppb or lower).

In the formation of the oxide semiconductor film 530, for example, a process object is held in a treatment chamber that is kept under reduced pressure and the process object may be heated so that the temperature of the process object is higher than or equal to 100° C. and lower than 550° C., preferably higher than or equal to 200° C. and lower than or equal to 400° C. Alternatively, the temperature of the process object in the formation of the oxide semiconductor film 530 may be room temperature (25° C.±10° C. (higher than or equal to 15° C. and lower than or equal to 35° C.)). Then, a sputtering gas from which hydrogen, water, or the like is removed is introduced while moisture in the treatment chamber is removed, and the aforementioned target is used, whereby the oxide semiconductor film 530 is formed. The oxide semiconductor film 530 is formed while the process object is heated, so that impurities contained in the oxide semiconductor layer can be reduced. Further, damage due to sputtering can be reduced. In order to remove moisture in the treatment chamber, an entrapment vacuum pump is preferably used. For example, a cryopump, an ion pump, a titanium sublimation pump, or the like can be used. Alternatively, a turbo pump provided with a cold trap may be used. By evacuation with the cryopump or the like, hydrogen, water, and the like can be removed from the treatment chamber, whereby the impurity concentration in the oxide semiconductor film 530 can be reduced.

The oxide semiconductor film 530 can be formed under the following conditions, for example: the distance between the process object and the target is 170 mm, the pressure is 0.4 Pa, the direct-current (DC) power is 0.5 kW, and the atmosphere is an oxygen atmosphere (the proportion of oxygen is 100%), an argon atmosphere (the proportion of argon is 100%), or a mixed atmosphere containing oxygen and argon. A pulse-direct current (DC) power source is preferably used because powder substances (also referred to as particles or dust) generated in the film formation can be reduced and the film thickness can be uniform. The thickness of the oxide semiconductor film 530 is greater than or equal to 1 nm and less than or equal to 50 nm, preferably greater than or equal to 1 nm and less than or equal to 30 m, more preferably greater than or equal to 1 nm and less than or equal to 10 nm. With the oxide semiconductor film 530 having such a thickness, a short-channel effect due to miniaturization can be suppressed. Note that the appropriate thickness differs depending on the oxide semiconductor material to be used, the intended use of the semiconductor device, and the like; therefore, the thickness may be determined in accordance with the material, the intended use, and the like.

Note that before the oxide semiconductor film 530 is formed by a sputtering method, a substance attached to a surface where the oxide semiconductor film 530 is to be formed (e.g., a surface of the gate insulating layer 507) is preferably removed by reverse sputtering in which an argon gas is introduced and plasma is generated. Here, the reverse sputtering is a method in which ions collide with a process surface so that the surface is modified, in contrast to normal sputtering in which ions collide with a sputtering target. As an example of a method for making ions collide with a process surface, there is a method in which high-frequency voltage is applied to the process surface in an argon atmosphere so that plasma is generated in the vicinity of the process object. Note that an atmosphere of nitrogen, helium, oxygen, or the like may be used instead of an argon atmosphere.

Next, the oxide semiconductor film 530 is processed into an island-shaped oxide semiconductor layer through a second photolithography process. Note that a resist mask used in the photolithography process may be formed by an inkjet method. Formation of the resist mask by an inkjet method needs no photomask; thus, manufacturing cost can be reduced.

In the case where a contact hole is formed in the gate insulating layer 507, a step of forming the contact hole can be performed at the same time as processing of the oxide semiconductor film 530.

As the etching of the oxide semiconductor film 530, either wet etching or dry etching or both of them may be employed. As an etchant used for wet etching of the oxide semiconductor film 530, a solution obtained by mixing phosphoric acid, acetic acid, and nitric acid or the like can be used. An etchant such as ITO-07N (produced by KANTO CHEMICAL CO., INC.) may also be used.

Figure 11B:
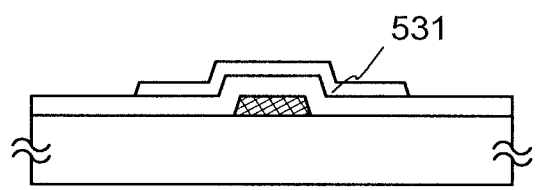

Then, heat treatment (first heat treatment) is performed on the oxide semiconductor layer, so that an oxide semiconductor layer 531 is formed (see FIG. 11B). By the first heat treatment, excessive hydrogen (including water and hydroxyl) in the oxide semiconductor layer is removed and a structure of the oxide semiconductor layer is improved, so that defect level in energy gap can be reduced. The temperature of the first heat treatment is, for example, higher than or equal to 300° C. and lower than 550° C., or higher than or equal to 400° C. and lower than or equal to 500° C.

The heat treatment can be performed in such a way that, for example, a process object is introduced into an electric furnace in which a resistance heating element or the like is used and heated at 450° C. under a nitrogen atmosphere for an hour. During the heat treatment, the oxide semiconductor layer is not exposed to the air, in order to prevent entry of water and hydrogen.

The heat treatment apparatus is not limited to an electric furnace; the heat treatment apparatus can be an apparatus that heats a process object using thermal conduction or thermal radiation from a medium such as a heated gas or the like. For example, an RTA (rapid thermal annealing) apparatus such as an LRTA (lamp rapid thermal annealing) apparatus or a GRTA (gas rapid thermal annealing) apparatus can be used. An LRTA apparatus is an apparatus for heating a process object using radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas which does not react with a process object by heat treatment, such as nitrogen or a rare gas such as argon is used.

For example, as the first heat treatment, GRTA treatment may be performed in the following manner. The process object is put in an inert gas atmosphere that has been heated, heated for several minutes, and then taken out of the inert gas atmosphere. The GRTA treatment enables high-temperature heat treatment in a short time. Moreover, in the GRTA treatment, even conditions of the temperature that exceeds the upper temperature limit of the process object can be employed. Note that the inert gas may be changed to a gas including oxygen during the process. This is because defect levels in the energy gap due to oxygen deficiency can be reduced by performing the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is set to 6N (99.9999%) or more, preferably 7N (99.99999%) or more (i.e., the impurity concentration is 1 ppm or less, preferably 0.1 ppm or less).

In any case, impurities are reduced by the first heat treatment so that the i-type (intrinsic) or substantially i-type oxide semiconductor layer is obtained. Accordingly, a transistor having significantly excellent characteristics can be realized.

The above heat treatment (first heat treatment) has an effect of removing hydrogen, water, and the like and thus can be referred to as dehydration treatment, dehydrogenation treatment, or the like. The dehydration treatment or the dehydrogenation treatment can be performed after the formation of the oxide semiconductor film 530 and before the oxide semiconductor film 530 is processed into the island-shaped oxide semiconductor layer. Such dehydration treatment or dehydrogenation treatment may be performed once or more times.

The first heat treatment can be performed at any of the following timings instead of the above timing: after formation of a source electrode layer and a drain electrode layer, after formation of an insulating layer over the source electrode layer and the drain electrode layer, and the like.

Next, a conductive film to be a source electrode layer and a drain electrode layer (including a wiring formed from the same layer as the source electrode layer and the drain electrode layer) is formed over the gate insulating layer 507 and the oxide semiconductor layer 531. The conductive film used to form the source electrode layer and the drain electrode layer can be formed using any of the materials described in the above embodiment.

Figure 11C:
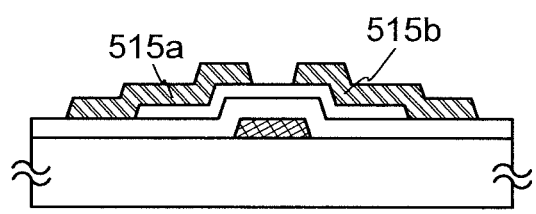

A resist mask is formed over the conductive film in a third photolithography process, and the source electrode layer 515a and the drain electrode layer 515b are formed by selective etching, and then, the resist mask is removed (see FIG. 11C).

Light exposure at the time of formation of the resist mask in the third photolithography process may be performed using ultraviolet light, KrF laser light, or ArF laser light. Note that the channel length (L) of the transistor is determined by the distance between the source electrode layer and the drain electrode layer. Therefore, in light exposure for forming a mask for a transistor with a channel length (L) of less than 25 nm, it is preferable to use extreme ultraviolet light whose wavelength is as short as several nanometers to several tens of nanometers. In light exposure using extreme ultraviolet light, resolution is high and depth of focus is large. For these reasons, the channel length (L) of the transistor completed later can be greater than or equal to 10 nm and less than or equal to 1000 nm (1 µm), and the circuit can operate at high speed. Moreover, power consumption of the semiconductor device can be reduced by miniaturization.

In order to reduce the number of photomasks and the number of photolithography processes, the etching step may be performed using a resist mask formed with a multi-tone mask. Since a resist mask formed with a multi-tone mask includes regions of plural thicknesses and can be further changed in shape by performing etching, the resist mask can be used in a plurality of etching steps to provide different patterns. Therefore, a resist mask corresponding to at least two kinds of different patterns can be formed with one multi-tone mask. Thus, the number of light-exposure masks can be reduced and the number of corresponding photolithography processes can also be reduced, whereby simplification of the process can be realized.

Note that it is preferable that etching conditions be optimized so as not to etch and divide the oxide semiconductor layer 531 when the conductive film is etched. However, it is difficult to obtain etching conditions in which only the conductive film is etched and the oxide semiconductor layer 531 is not etched at all. In some cases, part of the oxide semiconductor layer 531 is etched when the conductive film is etched, whereby the oxide semiconductor layer 531 having a groove portion (a recessed portion) is formed.

Either wet etching or dry etching may be used for the etching of the conductive film. Note that dry etching is preferably used in terms of miniaturization of elements. An etching gas and an etchant can be selected as appropriate in accordance with a material to be etched. In this embodiment, a titanium film is used as the conductive film and an In—Ga—Zn—O-based material is used for the oxide semiconductor layer 531; accordingly, in the case of employing wet etching, an ammonia hydrogen peroxide solution (a 31 wt. % hydrogen peroxide solution:28 wt. % ammonia water: water=5:2:2) can be used as an etchant.

Next, plasma treatment using a gas such as nitrous oxide ($N_2O$), nitrogen ($N_2$), or argon (Ar) is preferably performed, so that water, hydrogen, or the like attached to a surface of an exposed portion of the oxide semiconductor layer may be removed. In the case of performing the plasma treatment, an insulating layer 516 serving as a protective insulating film is formed without being exposed to the air after the plasma treatment.

The insulating layer 516 is preferably formed to a thickness of at least 1 nm by a method through which an impurity such as water or hydrogen is not introduced into the insulating layer 516, such as a sputtering method. When hydrogen is contained in the insulating layer 516, entry of the hydrogen to the oxide semiconductor layer, or extraction of oxygen in the oxide semiconductor layer by the hydrogen is caused, thereby causing the backchannel of the oxide semiconductor layer to have lower resistance (to have an n-type conductivity), so that a parasitic channel may be formed. As the insulating layer 516, a silicon oxide film, a silicon oxynitride film, an aluminum oxide film, an aluminum oxynitride film, or the like is preferably used.

In this embodiment, a silicon oxide film is formed to a thickness of 200 nm by a sputtering method as the insulating layer 516. The substrate temperature in deposition may be higher than or equal to room temperature (25° C.) and lower than or equal to 300° C., and is 100° C. in this embodiment. The silicon oxide film can be deposited by a sputtering method in a rare gas (typically, argon) atmosphere, an oxygen atmosphere, or a mixed atmosphere containing a rare gas and oxygen. As a target, a silicon oxide target or a silicon target may be used.

In order to remove moisture remaining in the deposition chamber of the insulating layer 516 at the same time as deposition of the oxide semiconductor film 530, an entrapment vacuum pump (such as a cryopump) is preferably used. When the insulating layer 516 is deposited in the deposition chamber which is evacuated using a cryopump, the impurity concentration in the insulating layer 516 can be reduced. A turbo pump provided with a cold trap may be used as an evacuation unit for removing moisture remaining in the deposition chamber used for forming the insulating layer 516.

A sputtering gas used for forming the insulating layer 516 is preferably a high-purity gas from which an impurity such as hydrogen or water is removed.

Next, second heat treatment is performed in an inert gas atmosphere or an oxygen gas atmosphere. The second heat treatment is performed at a temperature higher than or equal to 200° C. and lower than or equal to 450° C., preferably higher than or equal to 250° C. and lower than or equal to 350° C. For example, the heat treatment may be performed at 250° C. for 1 hour in a nitrogen atmosphere. The second heat treatment can reduce variation in electric characteristics of the transistor. By supply of oxygen from the insulating layer 516 to the oxide semiconductor layer 531, an oxygen vacancy in the oxide semiconductor layer 531 is reduced, whereby an i-type (intrinsic) or substantially i-type oxide semiconductor layer can be formed.

In this embodiment, the second heat treatment is performed after the formation of the insulating layer 516; however, the timing of the second heat treatment is not limited thereto. For example, the first heat treatment and the second heat treatment may be successively performed, or the first heat treatment may double as the second heat treatment.

In the above-described manner, through the first heat treatment and the second heat treatment, the oxide semiconductor layer 531 is purified so as to contain as few impurities that are not main components of the oxide semiconductor layer as possible, whereby the oxide semiconductor layer 531 can become an i-type (intrinsic) oxide semiconductor layer.

Figure 11D:
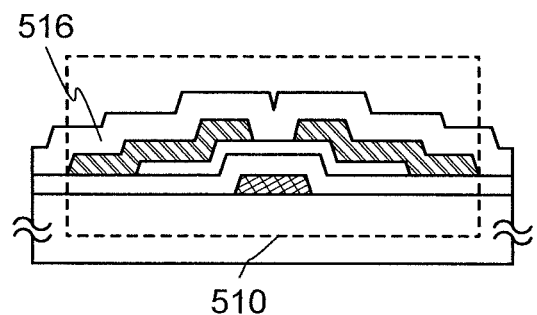

Through the above-described process, the transistor 510 is formed (see FIG. 11D).

Figure 11E:
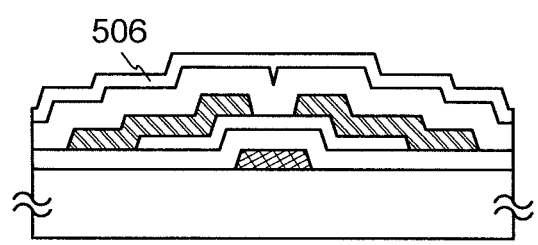

It is preferable to further form a protective insulating layer 506 over the insulating layer 516 (see FIG. 11E). The protective insulating layer 506 prevents entry of hydrogen, water, and the like from the outside. As the protective insulating layer 506, a silicon nitride film, an aluminum nitride film, or the like can be used, for example. The formation method of the protective insulating layer 506 is not particularly limited; however, an RF sputtering method is suitable for forming the protective insulating layer 506 because it achieves high productivity.

After the formation of the protective insulating layer 506, heat treatment may be further performed at a temperature higher than or equal to 100° C. and lower than or equal to 200° C. for 1 hour to 30 hours in the air.

A transistor which includes a purified oxide semiconductor layer and is manufactured in accordance with this embodiment as described above has a characteristic of significantly small off-state current. Therefore, with the use of the transistor, the potential of a node can be easily held. The use of such a transistor for a pulse signal output circuit and a shift register can significantly reduce the probability of causing a malfunction of the pulse signal output circuit and the shift register.

The structures, methods, and the like described in this embodiment can be combined as appropriate with any of the structures, methods, and the like described in the other embodiments.

Embodiment 6

With the use of the shift register whose example is described in any of Embodiments 1 to 3, a semiconductor device having a display function (also referred to as a display device) can be manufactured. Further, part or the whole of a driver circuit can be formed over the same substrate as a pixel portion, whereby a system-on-panel can be obtained.

As a display element used for the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Figure 12A:
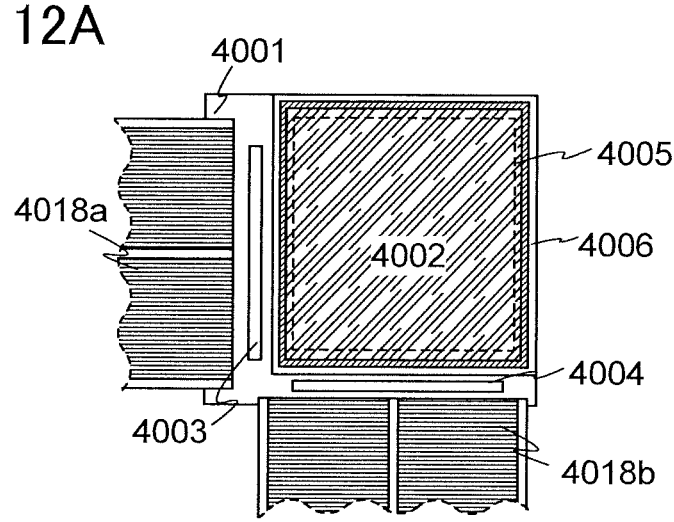
FIGS. 12A to 12C each show one mode of a semiconductor device.

In FIG. 12A, a sealant 4005 is provided so as to surround a pixel portion 4002 provided over a first substrate 4001, and the pixel portion 4002 is sealed between the first substrate 4001 and a second substrate 4006. In FIG. 12A, a scan line driver circuit 4004 and a signal line driver circuit 4003 which are formed over a substrate separately prepared are mounted in a region which is different from a region surrounded by the sealant 4005 over the first substrate 4001.

Further, a variety of signals and potentials are supplied to the signal line driver circuit 4003 which is separately formed, and the scan line driver circuit 4004 or the pixel portion 4002 from flexible printed circuits (FPCs) 4018a and 4018b.

Figure 12B:
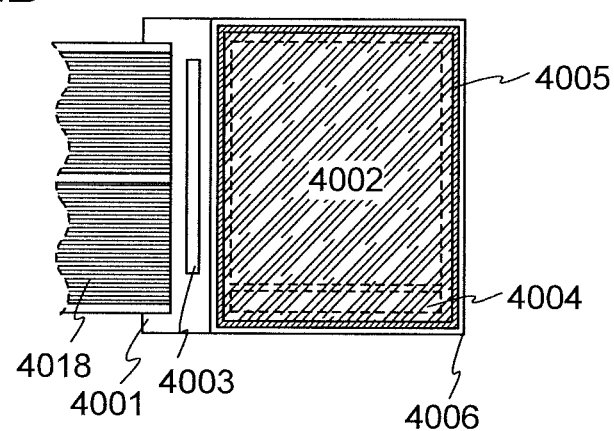
Figure 12C:
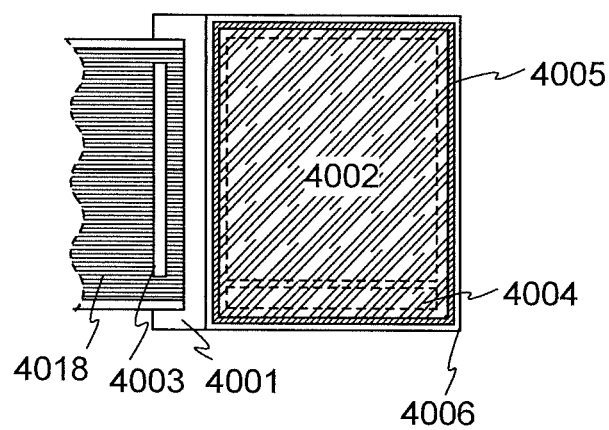

In FIGS. 12B and 12C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with the display element, by the first substrate 4001, the sealant 4005, and the second substrate 4006. In FIGS. 12B and 12C, the signal line driver circuit 4003 which is formed over a substrate separately prepared is mounted in a region which is different from a region surrounded by the sealant 4005 over the first substrate 4001. In FIGS. 12B and 12C, a variety of signals and potentials are supplied to the signal line driver circuit 4003 which is separately formed, and the scan line driver circuit 4004 or the pixel portion 4002 from an FPC 4018.

Although FIGS. 12B and 12C each illustrate an example in which the signal line driver circuit 4003 is formed separately and mounted on the first substrate 4001, the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be used. FIG. 12A illustrates an example in which the signal line driver circuit 4003 and the scan line driver circuit 4004 are mounted by a COG method. FIG. 12B illustrates an example in which the signal line driver circuit 4003 is mounted by a COG method. FIG. 12C illustrates an example in which the signal line driver circuit 4003 is mounted by a TAB method.

In addition, the display device includes a panel in which the display element is sealed, and a module in which an IC or the like including a controller is mounted on the panel.

Note that a display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

Further, the pixel portion provided over the first substrate includes a plurality of transistors, and the transistors which are illustrated in the aforementioned embodiment as an example can be used for the transistors.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like is used. These liquid crystal materials exhibit a cholesteric phase, a smectic phase, a cubic phase, a chiral nematic phase, an isotropic phase, or the like depending on conditions.

Alternatively, a liquid crystal exhibiting a blue phase for which an alignment film is unnecessary may be used. A blue phase is one of liquid crystal phases, which is generated just before a cholesteric phase changes into an isotropic phase while temperature of a cholesteric liquid crystal is increased.

Since the blue phase appears only in a narrow temperature range, a liquid crystal composition containing a chiral agent at 5 wt % or more is used for a liquid crystal layer in order to improve the temperature range. The liquid crystal composition which includes a liquid crystal showing a blue phase and a chiral agent has a short response time of 1 msec or less, has optical isotropy, which makes the alignment process unneeded, and has a small viewing angle dependence. In addition, an alignment film does not need to be provided and thus rubbing treatment is not necessary. Therefore, electrostatic discharge damage caused by the rubbing treatment can be prevented and defects and damage of the liquid crystal display device in the manufacturing process can be reduced. Thus, liquid crystal display devices can be manufactured with improved productivity.

The specific resistivity of the liquid crystal material is greater than or equal to $1\times10^9$ Ω·cm, preferably greater than or equal to $1\times10^{11}$ Ω·cm, still preferably greater than or equal to $1\times10^{12}$ Ω·cm. Note that the specific resistance in this specification is measured at 20° C.

The size of a storage capacitor formed in the liquid crystal display device is set in consideration of the leakage current of the transistor provided in the pixel portion or the like so that charge can be held for a predetermined period. The size of the storage capacitor may be set in consideration of the off-state current of a transistor or the like.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like is used.

A normally black liquid crystal display device such as a transmissive liquid crystal display device utilizing a vertical alignment (VA) mode is preferable. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Some examples of the vertical alignment mode are given. For example, a multi-domain vertical alignment (MVA) mode, a patterned vertical alignment (PVA) mode, an ASV mode, or the like can be used. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that the disclosed invention is not limited to the application to a display device for color display; the disclosed invention can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Because of such a mechanism, the light-emitting element is called a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions.

Further, an electronic paper in which electronic ink is driven can be provided as the display device. The electronic paper is also called an electrophoretic display device (electrophoretic display) and has advantages in that it has the same level of readability as regular paper, it has less power consumption than other display devices, and it can be set to have a thin and light form.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed using a single material selected from a conductive material, an insulating material, a semiconductor material, a magnetic material, a liquid crystal material, a ferroelectric material, an electroluminescent material, an electrochromic material, or a magnetophoretic material or formed using a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control alignment of the spherical particles, so that display is performed.

The pulse signal output circuit described in Embodiment 1 or Embodiment 2 is used for the display device whose example is described above, whereby the display device can have a variety of functions.

The structures, methods, and the like described in this embodiment can be combined as appropriate with any of the structures, methods, and the like described in the other embodiments.

Embodiment 7

A semiconductor device disclosed in this specification can be used in a variety of electronic devices (including game machines). Examples of electronic devices are a television set (also referred to as a television or a television receiver), a monitor of a computer or the like, a camera such as a digital camera or a digital video camera, a digital photo frame, a cellular phone handset (also referred to as a cellular phone or a cellular phone device), a portable game machine, a personal digital assistant, an audio reproducing device, a large game machine such as a pinball machine, and the like.

Figure 13A:
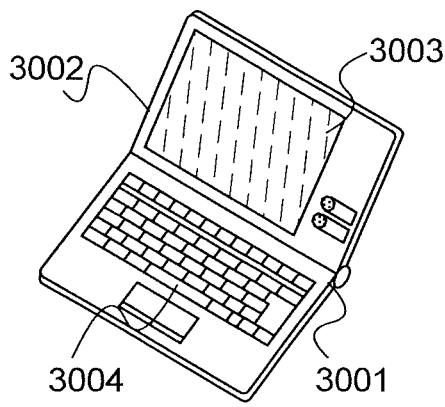
FIGS. 13A to 13F each show an electronic device.

FIG. 13A illustrates a laptop personal computer which includes at least the semiconductor device disclosed in this specification as a component. The laptop personal computer includes a main body 3001, a housing 3002, a display portion 3003, a keyboard 3004, and the like.

Figure 13B:
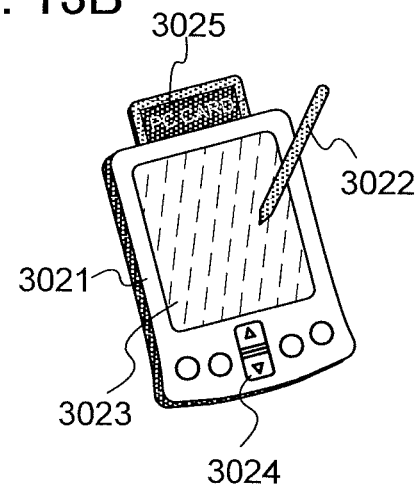

FIG. 13B illustrates a personal digital assistant (PDA) which includes at least the semiconductor device disclosed in this specification as a component. A main body 3021 is provided with a display portion 3023, an external interface 3025, operation buttons 3024, and the like. A stylus 3022 is included as an accessory for operation.

Figure 13C:
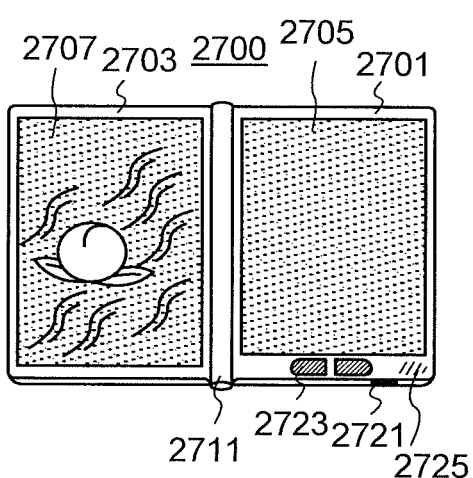

The semiconductor device disclosed in this specification can be used as an electronic paper. FIG. 13C illustrates an e-book reader which includes the electronic paper as a component. FIG. 13C illustrates an example of the e-book reader. For example, an e-book reader 2700 includes two housings 2701 and 2703. The housings 2701 and 2703 are combined with each other with a hinge 2711 so that the e-book reader 2700 can be opened and closed with the hinge 2711 used as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 13C) can display text and a display portion on the left side (the display portion 2707 in FIG. 13C) can display images.

FIG. 13C illustrates an example in which the housing 2701 includes an operation portion and the like. For example, the housing 2701 includes a power switch 2721, operation keys 2723, a speaker 2725, and the like. With the operation keys 2723, pages can be turned. Note that a keyboard, a pointing device, or the like may be provided on the same surface as the display portion of the housing. Further, an external connection terminal (e.g., an earphone terminal or a USB terminal), a recording medium insertion portion, and the like may be provided on a back surface or a side surface of the housing. Furthermore, the e-book reader 2700 may function as an electronic dictionary.

Further, the e-book reader 2700 may transmit and receive data wirelessly. Through wireless communication, desired book data or the like can be purchased and downloaded from an electronic book server.

Figure 13D:
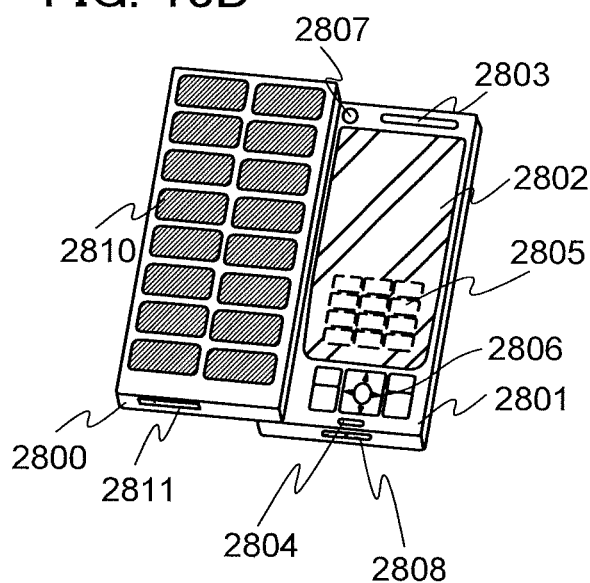

FIG. 13D illustrates a cellular phone which includes at least the semiconductor device disclosed in this specification as a component. The cellular phone includes two housings 2800 and 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 for storing electricity in a personal digital assistant, an external memory slot 2811, and the like. Further, an antenna is incorporated in the housing 2801.

Further, the display panel 2802 includes a touch panel. A plurality of operation keys 2805 which are displayed as images are indicated by dashed lines in FIG. 13D. Note that the cellular phone includes a boosting circuit for raising a voltage output from the solar cell 2810 to a voltage necessary for each circuit.

The display direction of the display panel 2802 is changed as appropriate depending on a usage pattern. Further, since the cellular phone includes the camera lens 2807 on the same surface as the display panel 2802, it can be used as a video phone. The speaker 2803 and the microphone 2804 can be used for videophone calls, recording, playback, and the like as well as voice calls. Furthermore, the housings 2800 and 2801 which are developed as illustrated in FIG. 13D can overlap with each other by sliding; thus, the size of the cellular phone can be decreased, which makes the cellular phone suitable for being carried.

The external connection terminal 2808 can be connected to an AC adapter and a variety of cables such as a USB cable, and charging and data communication with a personal computer or the like are possible. Further, a large amount of data can be stored and moved by insertion of a storage medium into the external memory slot 2811.

Further, the cellular phone may have an infrared communication function, a television reception function, or the like in addition to the above functions.

Figure 13E:
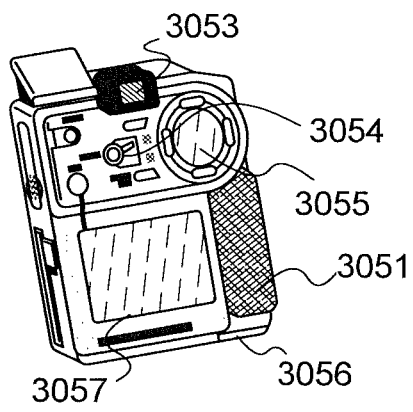

FIG. 13E illustrates a digital video camera which includes at least the semiconductor device disclosed in this specification as a component. The digital video camera includes a main body 3051, a first display portion 3057, an eyepiece portion 3053, operation switches 3054, a second display portion 3055, a battery 3056, and the like.

Figure 13F:
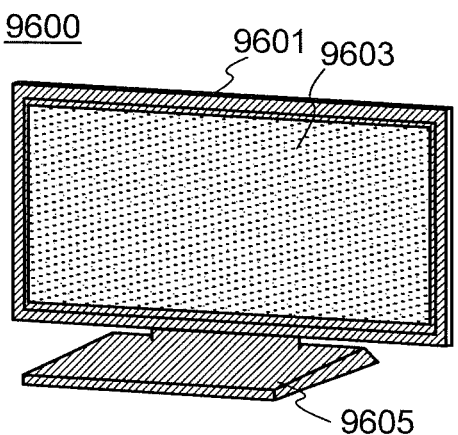
Figure 14:
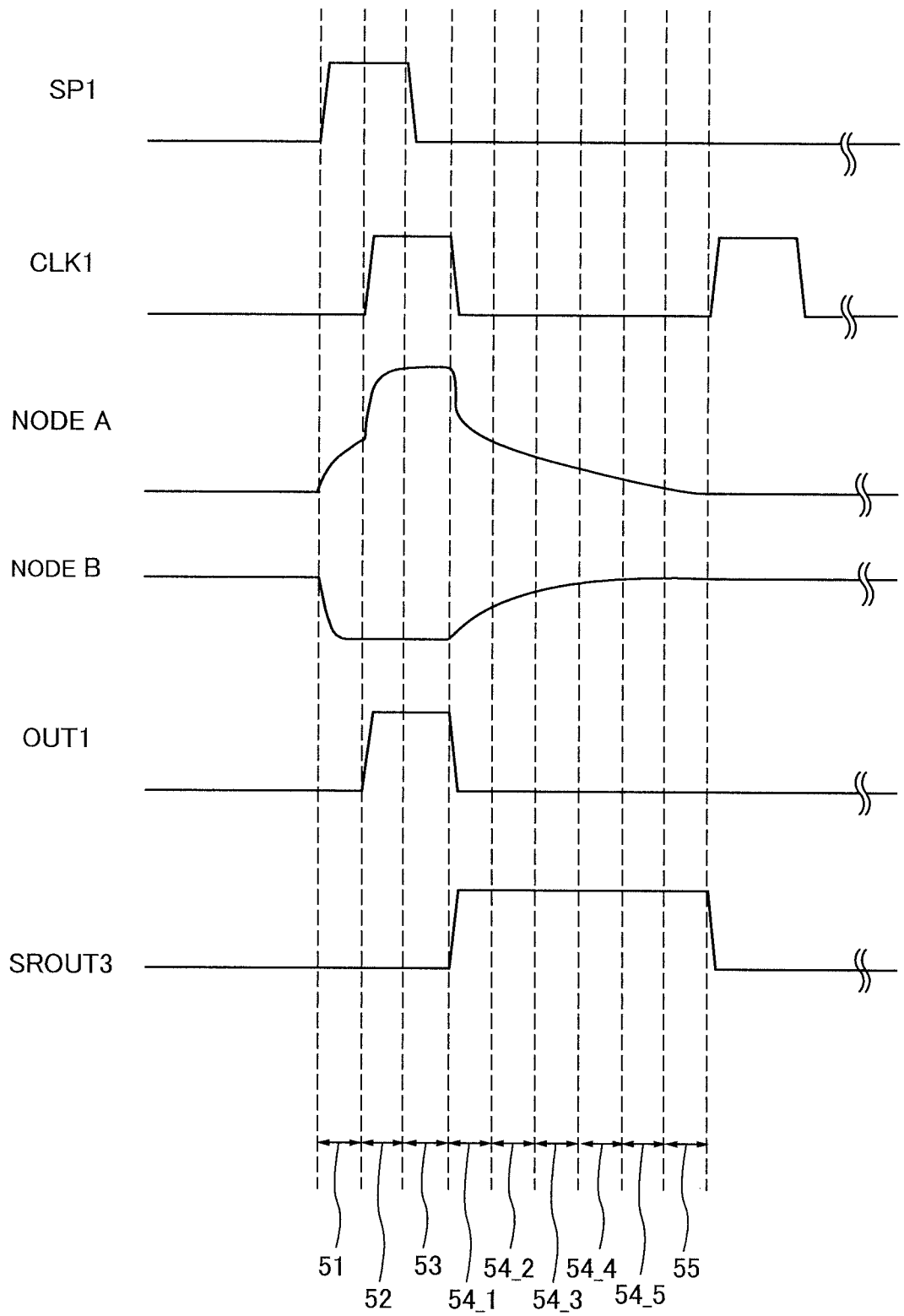
FIG. 14 is a timing chart of a shift register.

FIG. 13F illustrates an example of a television set which includes at least the semiconductor device disclosed in this specification as a component. In a television set 9600, a display portion 9603 is incorporated in a housing 9601. The display portion 9603 can display images. Here, the housing 9601 is supported by a stand 9605.

The television set 9600 can be operated by an operation switch of the housing 9601 or a remote control. Further, the remote control may include a display portion for displaying data output from the remote control.

Note that the television set 9600 includes a receiver, a modem, and the like. With the receiver, general television broadcasts can be received. Further, when the television set is connected to a communication network with or without wires via the modem, one-way (from a transmitter to a receiver) or two-way (between a transmitter and a receiver or between receivers) data communication can be performed.

The structures, methods, and the like described in this embodiment can be combined as appropriate with any of the structures, methods, and the like described in the other embodiments.

This application is based on Japanese Patent Application serial no. 2010-045884 filed with Japan Patent Office on Mar. 2, 2010, the entire contents of which are hereby incorporated by reference.

EXPLANATION OF REFERENCE

11: signal line, 12: signal line, 13: signal line, 14: signal line, 15: wiring, 21: input terminal, 22: input terminal, 23: input terminal, 24: input terminal, 25: input terminal, 26: output terminal, 27: output terminal, 31: power supply line, 32: power supply line, 51: period, 52: period, 53: period, 54: period, 55: period, 56: period, 101: transistor, 102: transistor, 103: transistor, 104: transistor, 105: transistor, 106: transistor, 107: transistor, 108: transistor, 109: transistor, 110: transistor, 111: transistor, 200: pulse signal generation circuit, 201: first input signal generation circuit, 202: second input signal generation circuit, 203: second input signal generation circuit, 204: dummy pulse signal generation circuit, 205: first input signal generation circuit, 206: second input signal generation circuit, 400: substrate, 401: gate electrode layer, 402: gate insulating layer, 403: oxide semiconductor layer, 405*a*: source electrode layer, 405*b*: drain electrode layer, 407: insulating layer, 409: protective insulating layer, 410: transistor, 420: transistor, 427: insulating layer, 430: transistor, 436*a*: wiring layer, 436*b*: wiring layer, 437: insulating layer, 440: transistor, 505: substrate, 506: protective insulating layer, 507: gate insulating layer, 510: transistor, 511: gate electrode layer, 515*a*: source electrode layer, 515*b*: drain electrode layer, 516: insulating layer, 530: oxide semiconductor film, 531: oxide semiconductor layer, 2700: e-book reader, 2701: housing, 2703: housing, 2705: display portion, 2707: display portion, 2711: hinge, 2721: power switch, 2723: operation key, 2725: speaker, 2800: housing, 2801: housing, 2802: display panel, 2803: speaker, 2804: microphone, 2805: operation key, 2806: pointing device, 2807: camera lens, 2808: external connection terminal, 2810: solar cell, 2811: external memory slot, 3001: main body, 3002: housing, 3003: display portion, 3004: keyboard, 3021: main body, 3022: stylus, 3023: display portion, 3024: operation button, 3025: external interface, 3051: main body, 3053: eye piece portion, 3054: operation switch, 3055: display portion, 3056: battery, 3057: display portion, 4001: substrate, 4002: pixel portion, 4003: signal line driver circuit, 4004: scan line driver circuit, 4005: sealant, 4006: substrate, 4018: FPC, 4018*a*: FPC, 4018*b*: FPC, 9600: television set, 9601: housing, 9603: display portion, and 9605: stand

The invention claimed is:
1. A semiconductor device comprising:
a first transistor, a second transistor, a third transistor, a fourth transistor, a fifth transistor, a sixth transistor and a seventh transistor,
wherein each of the first transistor, the second transistor, the third transistor, the fourth transistor, the fifth transistor, the sixth transistor and the seventh transistor includes an oxide semiconductor layer in a channel region,
wherein a first clock signal is configured to be input to one of a source and a drain of the first transistor,
wherein the other of the source and the drain of the first transistor is directly connected to an output terminal,
wherein one of a source and a drain of the second transistor is directly connected to a power supply line,
wherein the other of the source and the drain of the second transistor is directly connected to the output terminal,
wherein one of a source and a drain of the third transistor is electrically connected to a gate of the first transistor,
wherein a start pulse is configured to be input to a gate of the third transistor,
wherein one of a source and a drain of the fourth transistor is electrically connected to the power supply line,
wherein the other of the source and the drain of the fourth transistor is electrically connected to the gate of the first transistor,
wherein one of a source and a drain of the fifth transistor is directly connected to a gate of the fourth transistor,
wherein one of a source and a drain of the sixth transistor is directly connected to the gate of the fourth transistor,
wherein one of a source and a drain of the seventh transistor is electrically connected to the gate of the fourth transistor,
wherein the other of the source and the drain of the seventh transistor is electrically connected to the power supply line,
wherein a second clock signal is configured to be input to a gate of the fifth transistor,
wherein a clock signal is not input to a gate of the sixth transistor,
wherein a ratio of a channel width to a channel length of the third transistor is larger than a ratio of a channel width to a channel length of the fourth transistor, and
wherein a channel width of the fifth transistor is smaller than a channel width of the sixth transistor.
2. The semiconductor device according to claim 1,
wherein each of the first transistor, the second transistor, the third transistor, the fourth transistor, the fifth transistor, the sixth transistor and the seventh transistor further includes a gate electrode layer, a gate insulating layer, a source electrode layer, a drain electrode layer, a first insulating layer and a second insulating layer,
wherein the gate insulating layer is provided over the gate electrode layer,
wherein the oxide semiconductor layer is provided over the gate insulating layer,
wherein the first insulating layer is provided over the oxide semiconductor layer,
wherein the first insulating layer has a region in contact with the oxide semiconductor layer,
wherein the first insulating layer includes silicon and oxide, and
wherein the second insulating layer includes silicon and nitrogen.

* * * * *